(12) United States Patent
Wang et al.

(10) Patent No.: US 12,640,206 B2
(45) Date of Patent: May 26, 2026

(54) POST-PROGRAM ERASE IN 3D NAND

(71) Applicant: Sandisk Technologies, Inc., Milpitas, CA (US)

(72) Inventors: Ming Wang, Shanghai (CN); Liang Li, Shanghai (CN); Xuan Tian, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 232 days.

(21) Appl. No.: 18/358,635

(22) Filed: Jul. 25, 2023

(65) Prior Publication Data

US 2024/0296891 A1 Sep. 5, 2024

Related U.S. Application Data

(60) Provisional application No. 63/488,249, filed on Mar. 3, 2023.

(51) Int. Cl.
| | |
|---|---|
| *G11C 16/16* | (2006.01) |
| *G11C 16/04* | (2006.01) |
| *G11C 16/08* | (2006.01) |
| *G11C 16/10* | (2006.01) |

(52) U.S. Cl.
CPC .......... *G11C 16/16* (2013.01); *G11C 16/0433* (2013.01); *G11C 16/08* (2013.01); *G11C 16/102* (2013.01)

(58) Field of Classification Search
CPC ..... G11C 16/16; G11C 16/0433; G11C 16/08; G11C 16/102; G11C 16/32; G11C 11/5635; G11C 16/0483; G11C 16/10
See application file for complete search history.

(56) References Cited

U.S. PATENT DOCUMENTS

| | | | |
|---|---|---|---|
| 6,788,580 | B2 | 9/2004 | Takahashi |
| 7,558,122 | B2 | 7/2009 | Kim et al. |
| 7,668,019 | B2 | 2/2010 | Byeon |
| 7,911,849 | B2 | 3/2011 | Hemink |

(Continued)

OTHER PUBLICATIONS

Malavena, G., Mannara, A., Lacaita, A.L. et al. "Compact modeling of GIDL-assisted erase in 3-D Nand Flash strings" Journal of Computational Electronics 18, 561-568 (2019). (Year: 2019).*

(Continued)

*Primary Examiner* — Alexander Sofocleous
*Assistant Examiner* — James S. Wells
(74) *Attorney, Agent, or Firm* — Pearl Cohen Zedek Latzer Baratz LLP

(57) ABSTRACT

Technology is disclosed herein for programing memory cells with a post-program erase. In an aspect, the post-program erase includes a bit-level erase that only erases memory cells that are to remain in an erased state after the program operation. Memory cells that are to remain in programmed states may be inhibited from erase during the post-program erase. In an aspect, the post-program erase does not have an erase verify, which saves time and/or power. In an aspect, the post-program erase includes applying a single erase pulse, which saves time and/or power. In an aspect, the duration of the post-program erase pulse is shorter than an erase pulse used prior to programming, which saves time and/or power.

14 Claims, 21 Drawing Sheets

(56)        References Cited

U.S. PATENT DOCUMENTS

| | | | |
|---|---|---|---|
| 8,077,524 B2 * | 12/2011 | Lutze | G11C 11/5635 |
| | | | 365/185.27 |
| RE45,699 E | 9/2015 | Lutze et al. | |
| 9,711,229 B1 | 7/2017 | Rabkin et al. | |
| 10,943,662 B1 * | 3/2021 | Linnen | G11C 16/08 |
| 2007/0252201 A1 * | 11/2007 | Kito | H10B 41/27 |
| | | | 257/E21.679 |
| 2010/0002513 A1 | 1/2010 | Lutze et al. | |
| 2010/0002514 A1 | 1/2010 | Lutze et al. | |
| 2010/0039864 A1 * | 2/2010 | Sarin | G11C 16/344 |
| | | | 365/230.03 |
| 2023/0043066 A1 * | 2/2023 | Tanaka | G06F 3/0679 |

OTHER PUBLICATIONS

Andrea Chimenton, Paolo Pellati, Piero Olivo, "Threshold voltage spread in flash memories under a constant ΔQ erasing scheme", Microelectronic Engineering, vol. 59, Issues 1-4, 2001, pp. 197-201, ISSN 0167-9317 (Year: 2001).*
Yoo, Ho-Nam, et al., "First Demonstration of 1-bit Erase in Vertical NAND Flash Memory," IEEE Symposium on VLSI Technology and Circuits, Jul. 2022, 2 pages.

\* cited by examiner

| Block M-1 |
| :-: |
| |
| ⋮ |
| |
| Block 2 |
| Block 1 |
| Block 0 |

407

| Block M-1 |
| :-: |
| |
| ⋮ |
| |
| Block 2 |
| Block 1 |
| Block 0 |

Figure 10A

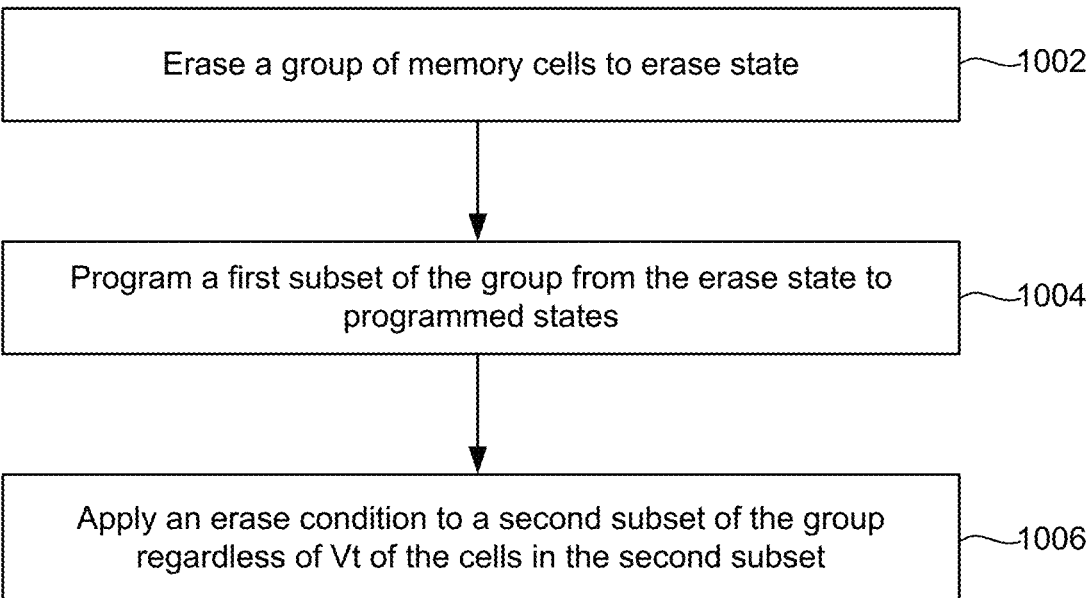

1000

Erase a group of memory cells to erase state ~1002

Program a first subset of the group from the erase state to programmed states ~1004

Apply an erase condition to a second subset of the group regardless of Vt of the cells in the second subset ~1006

Figure 10B

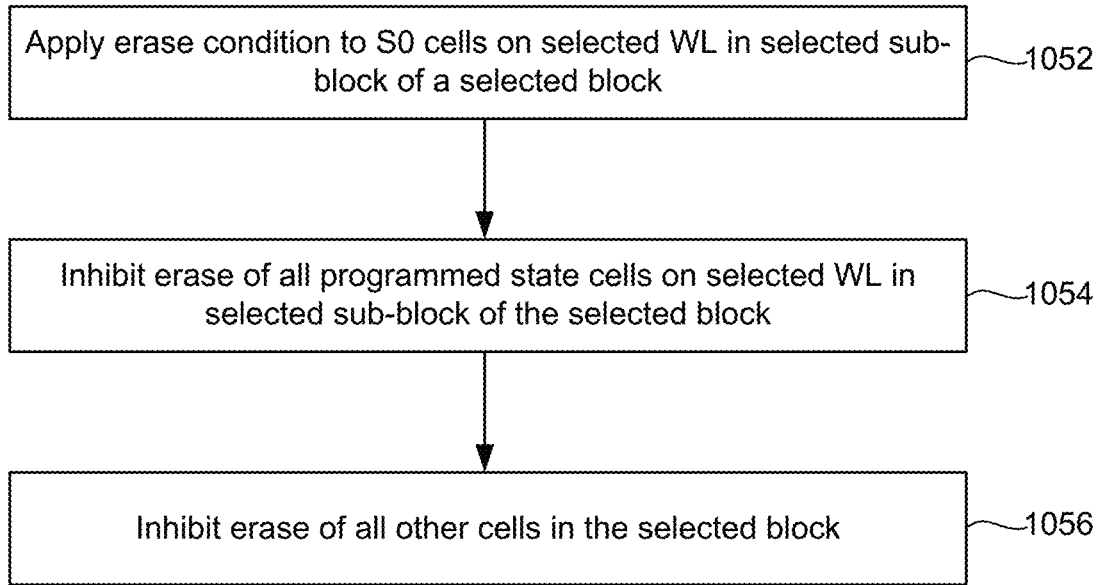

1050

Apply erase condition to S0 cells on selected WL in selected sub-block of a selected block ~1052

Inhibit erase of all programmed state cells on selected WL in selected sub-block of the selected block ~1054

Inhibit erase of all other cells in the selected block ~1056

Figure 12

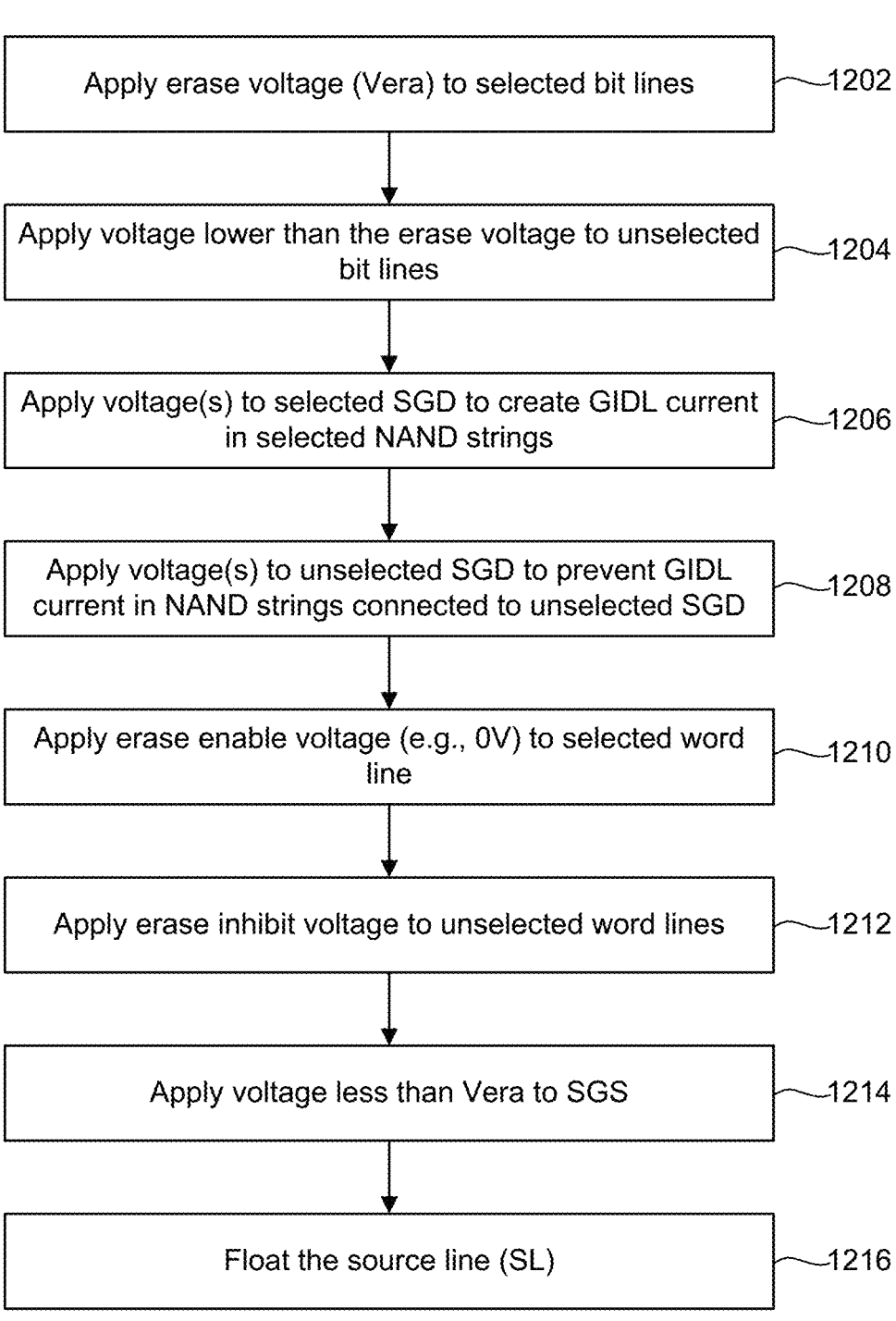

1200

Apply erase voltage (Vera) to selected bit lines — 1202

Apply voltage lower than the erase voltage to unselected bit lines — 1204

Apply voltage(s) to selected SGD to create GIDL current in selected NAND strings — 1206

Apply voltage(s) to unselected SGD to prevent GIDL current in NAND strings connected to unselected SGD — 1208

Apply erase enable voltage (e.g., 0V) to selected word line — 1210

Apply erase inhibit voltage to unselected word lines — 1212

Apply voltage less than Vera to SGS — 1214

Float the source line (SL) — 1216

POST-PROGRAM ERASE IN 3D NAND

CLAIM OF PRIORITY

The present application claims priority from U.S. Provisional Patent Application No. 63/488,249, entitled "POST-PROGRAM ERASE IN 3D NAND," by Wang et al., filed Mar. 3, 2023, incorporated by reference herein in its entirety.

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional 3D. One type of 3D structure has non-volatile memory cells arranged as vertical NAND strings. The 3D memory structure may be arranged into units that are commonly referred to as physical blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

For memory such as NAND, a large set of memory cells are erased prior to programming. Herein, a set of memory cells that are erased as a unit are referred to as an "erase block." In some cases an erase block coincides with a physical block. In some cases an erase block is a portion of a physical block. Then, the memory cells within the erase block are programmed one group at a time. The unit of programming is typically referred to as a physical page of memory cells. The non-volatile memory cells may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

BRIEF DESCRIPTION OF THE DRAWINGS

Like-numbered elements refer to common components in the different figures.

FIG. 4A is a block diagram of one example of a memory structure having two planes.

FIG. 10A is a flowchart of one embodiment of a process of programming memory cells followed by a post-program erase.

FIG. 10B is a flowchart of one embodiment of a process of a bit level post-program erase in 3D NAND.

FIG. 12 is a flowchart of one embodiment of a process of bit-level post-program erase in 3D NAND.

DETAILED DESCRIPTION

Technology is disclosed herein for programing memory cells with a post-program erase. In an embodiment, the post-program erase includes a bit-level erase that only erases memory cells that are to remain in the erased state. Memory cells that are to remain in programmed states may be inhibited from erase during the post-program erase. The post-program erase increases the gap between the erase state and programmed states. Therefore, the threshold voltage budget is increased. In an embodiment, the post-program erase does not have an erase verify, which saves time and/or power. In an embodiment, the post-program erase includes applying a single erase pulse, which saves time and/or power. In an embodiment, the duration of the post-program erase pulse is shorter than an erase pulse used prior to programming, which saves time and/or power.

Figure 1:
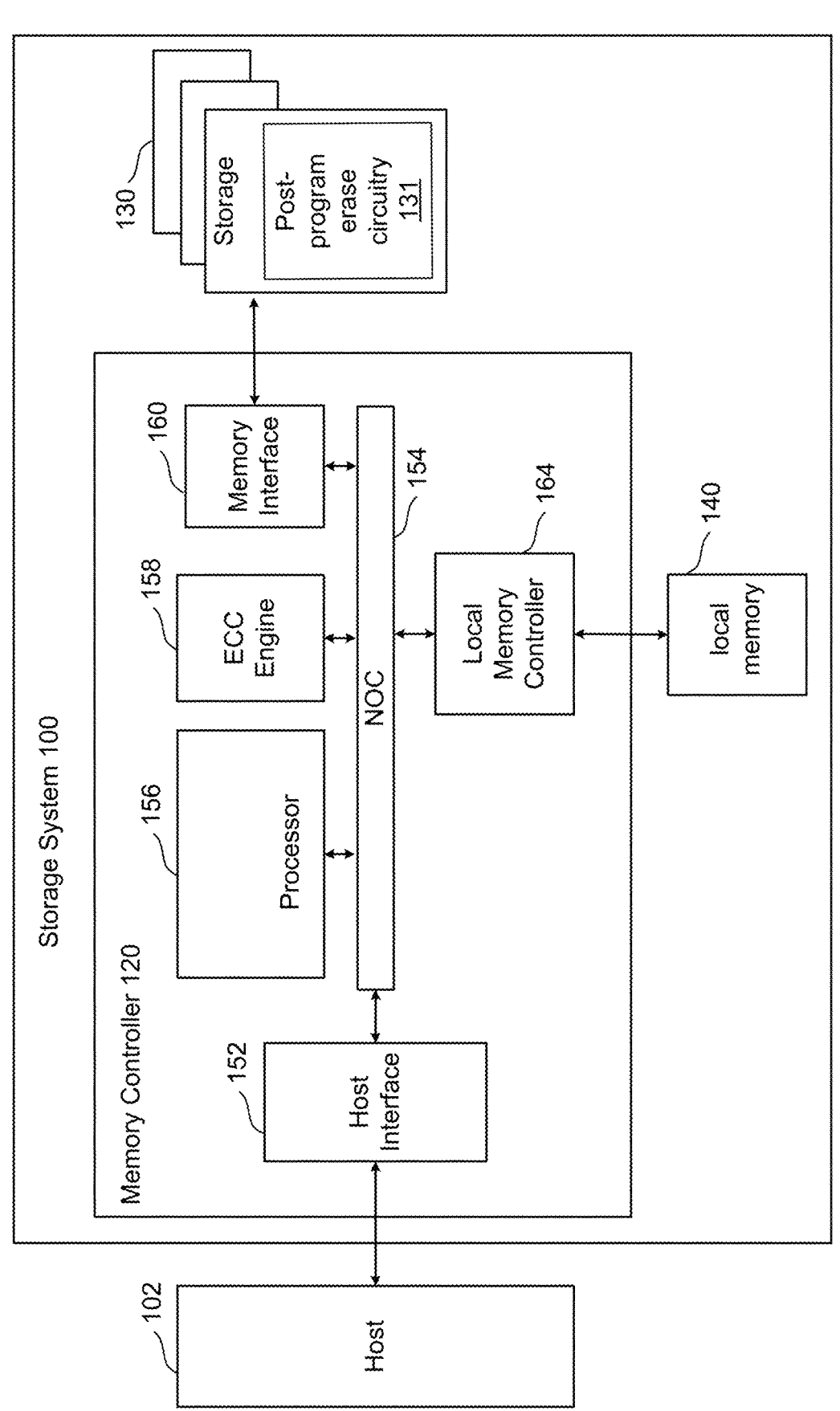
FIG. 1 is a block diagram depicting one embodiment of a storage system.

FIG. 1 is a block diagram of one embodiment of a storage system 100 that implements the technology described herein. In an embodiment, the storage system 100 is configured to implement a post-program erase. In one embodiment, storage system 100 is a solid state drive ("SSD"). Storage system 100 may be referred to as a "non-volatile storage system." Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

In an embodiment, the memory controller 120 instructs the storage 130 to perform a post-program erase operation. Post program erase circuitry 131 in the storage 130 may control the post-program erase at a die level. In an embodiment of a post-program erase operation, only those memory cells that are to remain in an erased state after the program are subjected to an erase condition. Other memory cells may be inhibited from erase during the post-program erase operation. Embodiments of a post-program erase operation are described herein. In some embodiments, the memory controller 120 instructs the storage 130 whether to perform a program operation either with post-program erase or without the post-program erase.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
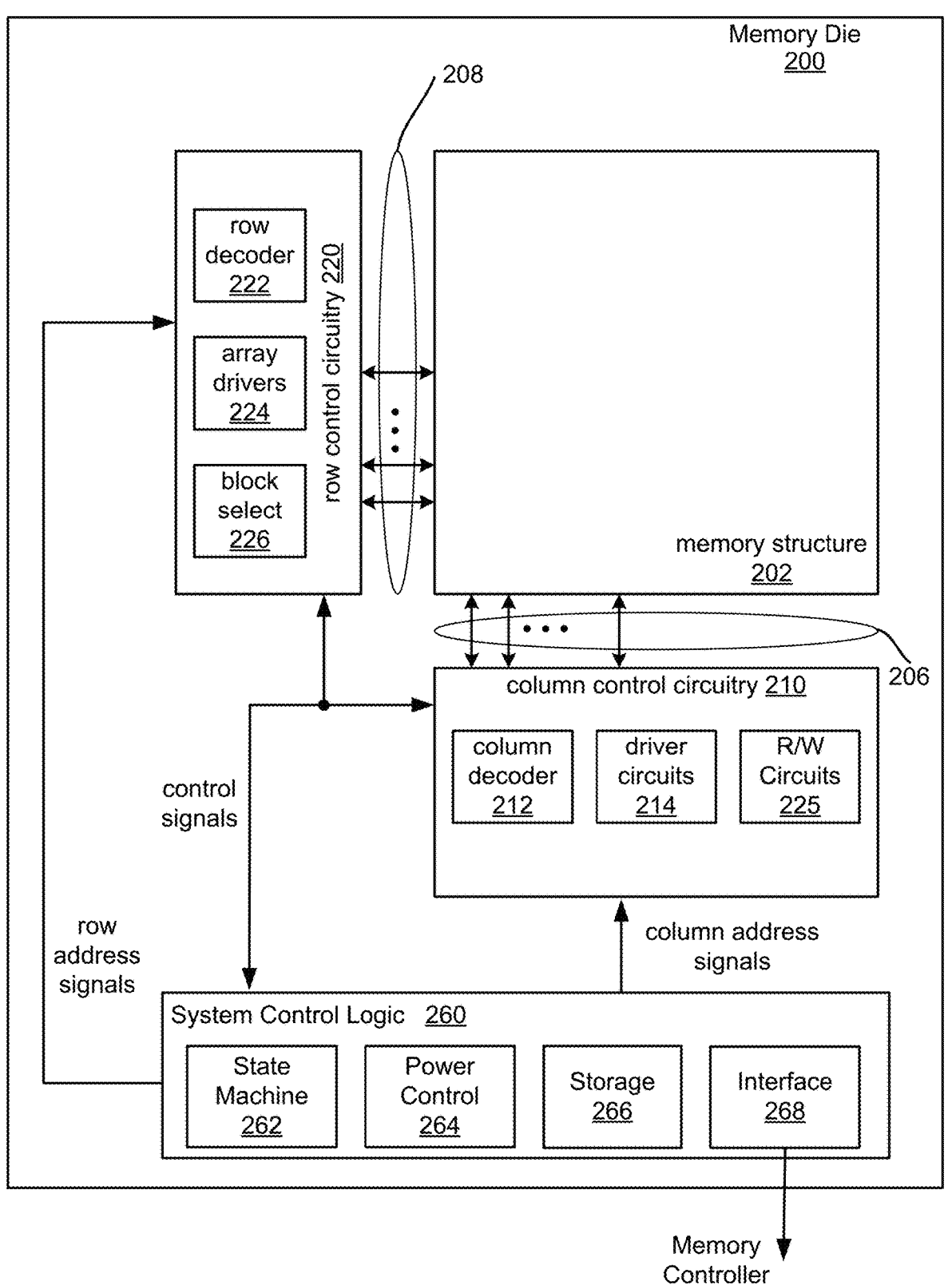
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used. In one embodiment, the memory die 200 receives a command via memory controller interface 268 to perform a post-program erase. In one embodiment, the state machine 262 contains post program erase circuitry 131 (not depicted in FIG. 2A) to control the post-program erase at a die level.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
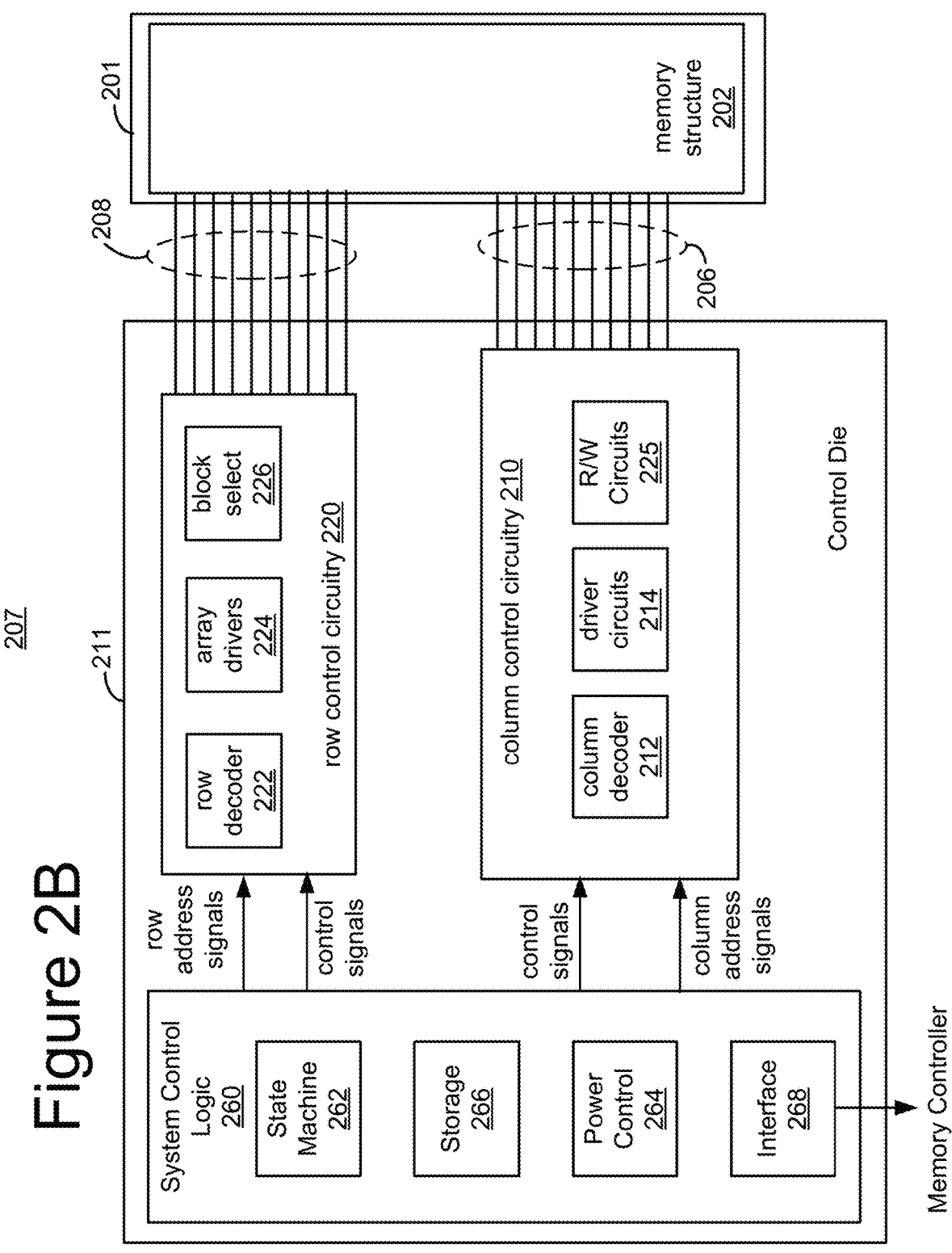
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include, but is not limited to, any one of or any combination of state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, storage 130, memory die 200, integrated memory assembly 207, and/or control die 211.

Figure 3A:
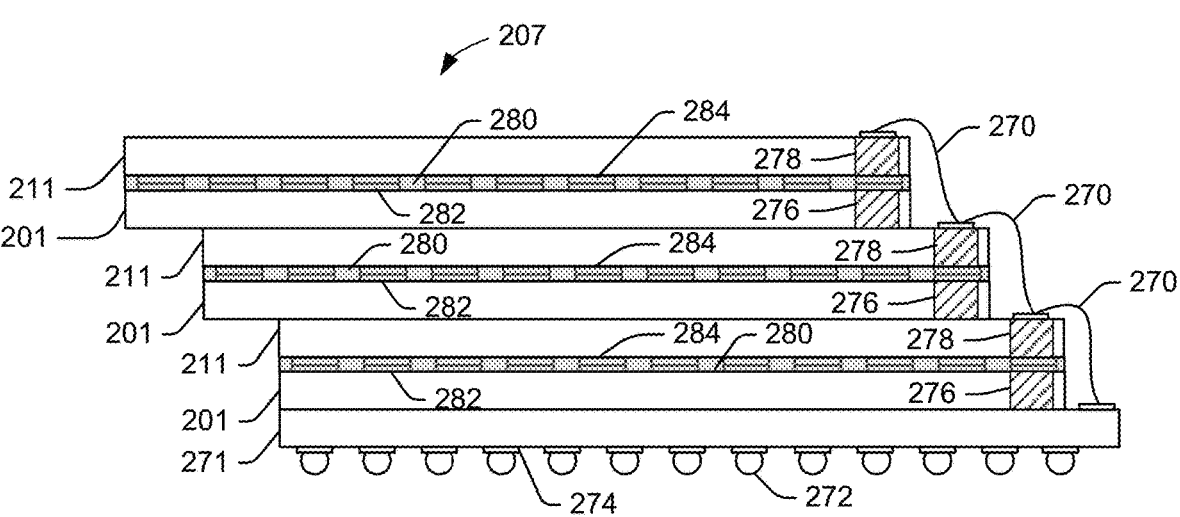
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
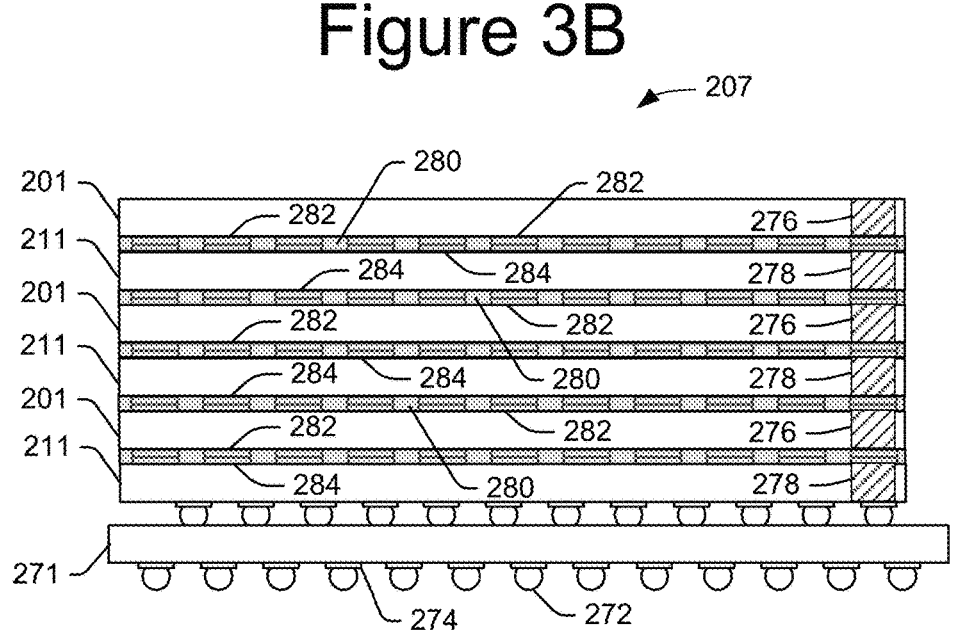

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
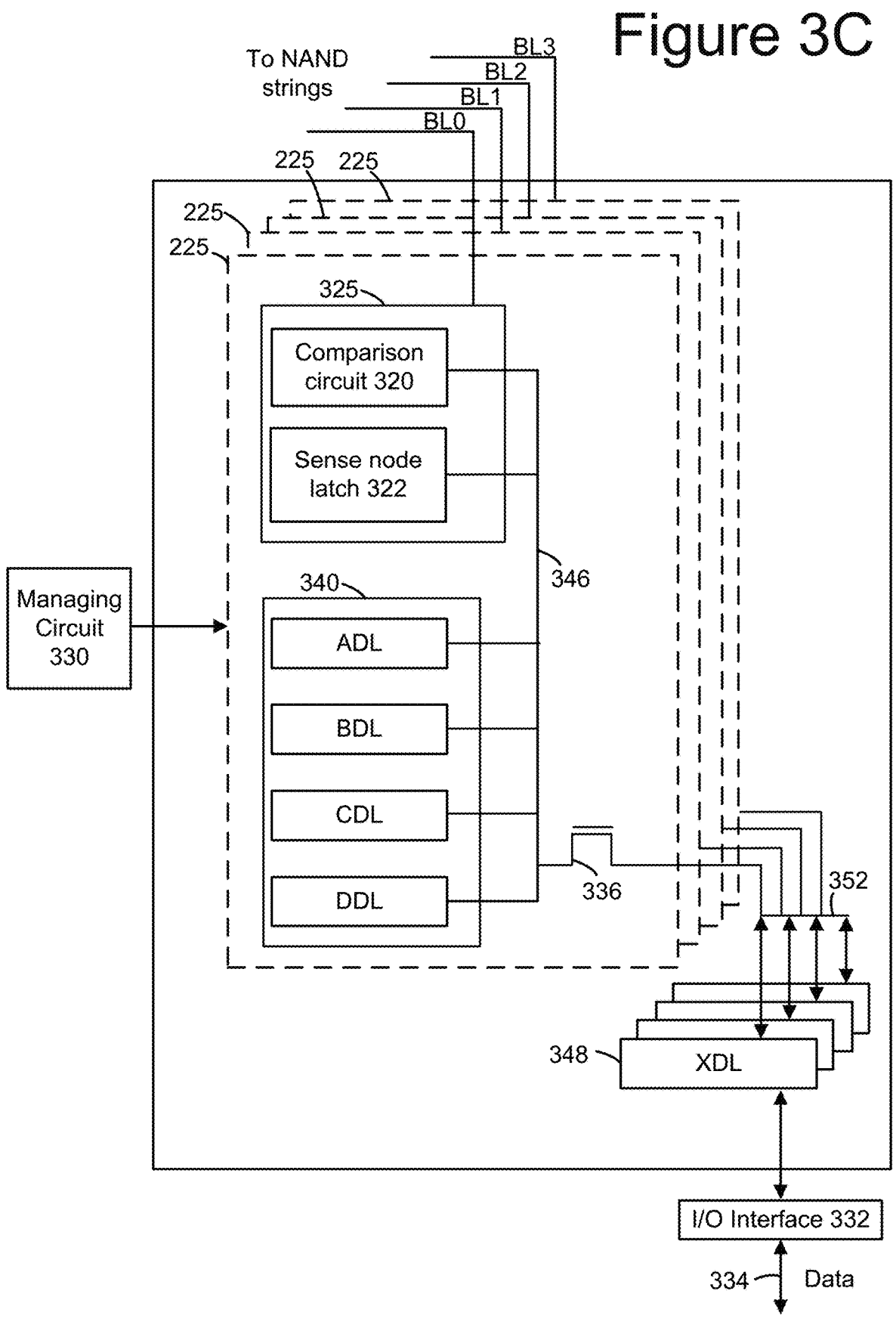
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include four latches (ADL, BDL, CDL, DDL) for each sense amplifier 325 in this example. More or fewer than four latches may be included in the data latches 340. In one embodiment, for programming each data latch 340 is used to store one bit to be stored into a memory cell and for reading each data latch 340 is used to store one bit read from a memory cell.

In a four bit per memory cell embodiment, ADL stores a bit for a lower page of data, BDL stores a bit for a middle page of data, CDL stores a bit for an upper page of data, and DDL store a bit for a top page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller 120.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
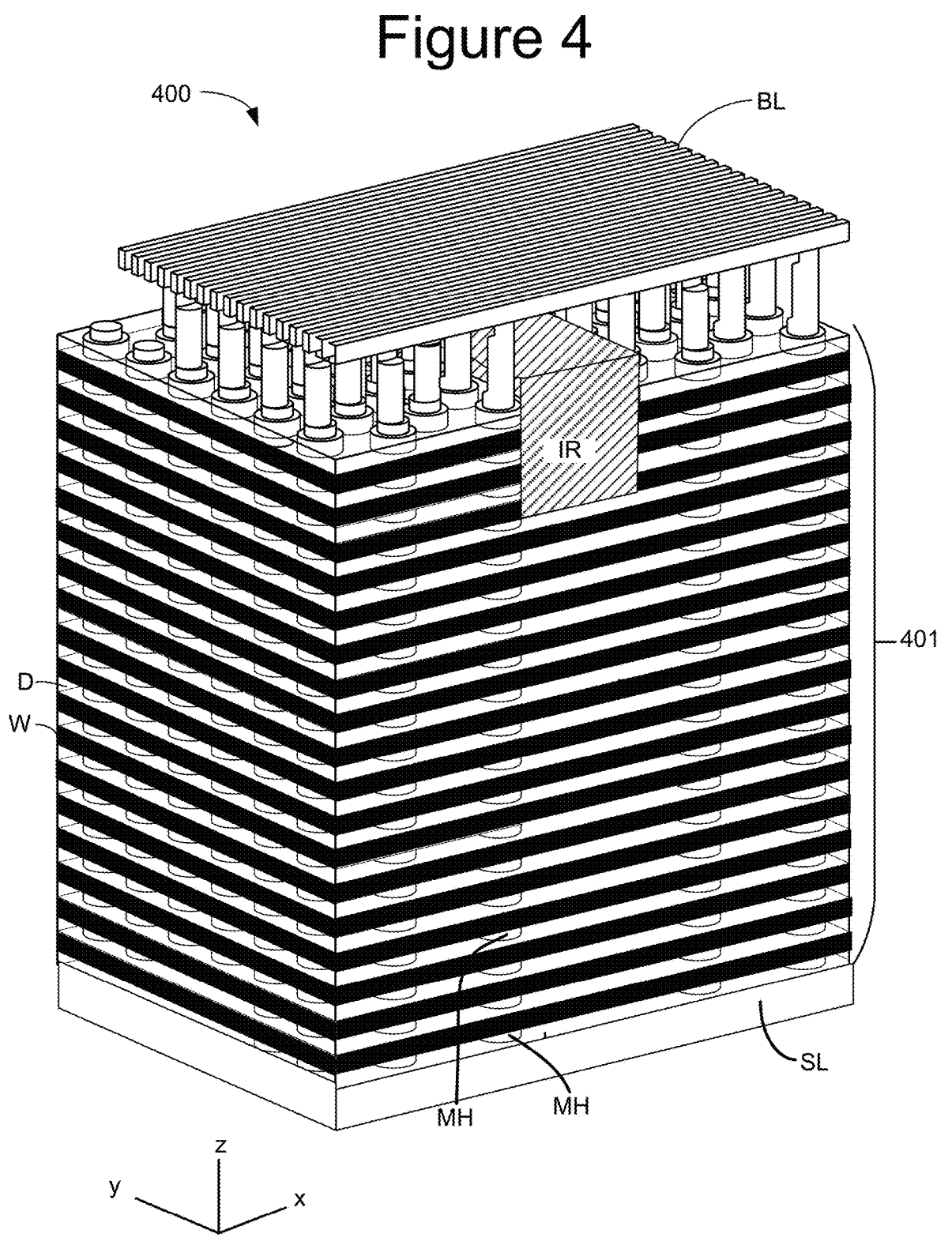
FIG. 4 is a perspective view of a portion of one example of a monolithic three dimensional memory structure.

FIG. 4 is a perspective view of a portion of one example of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
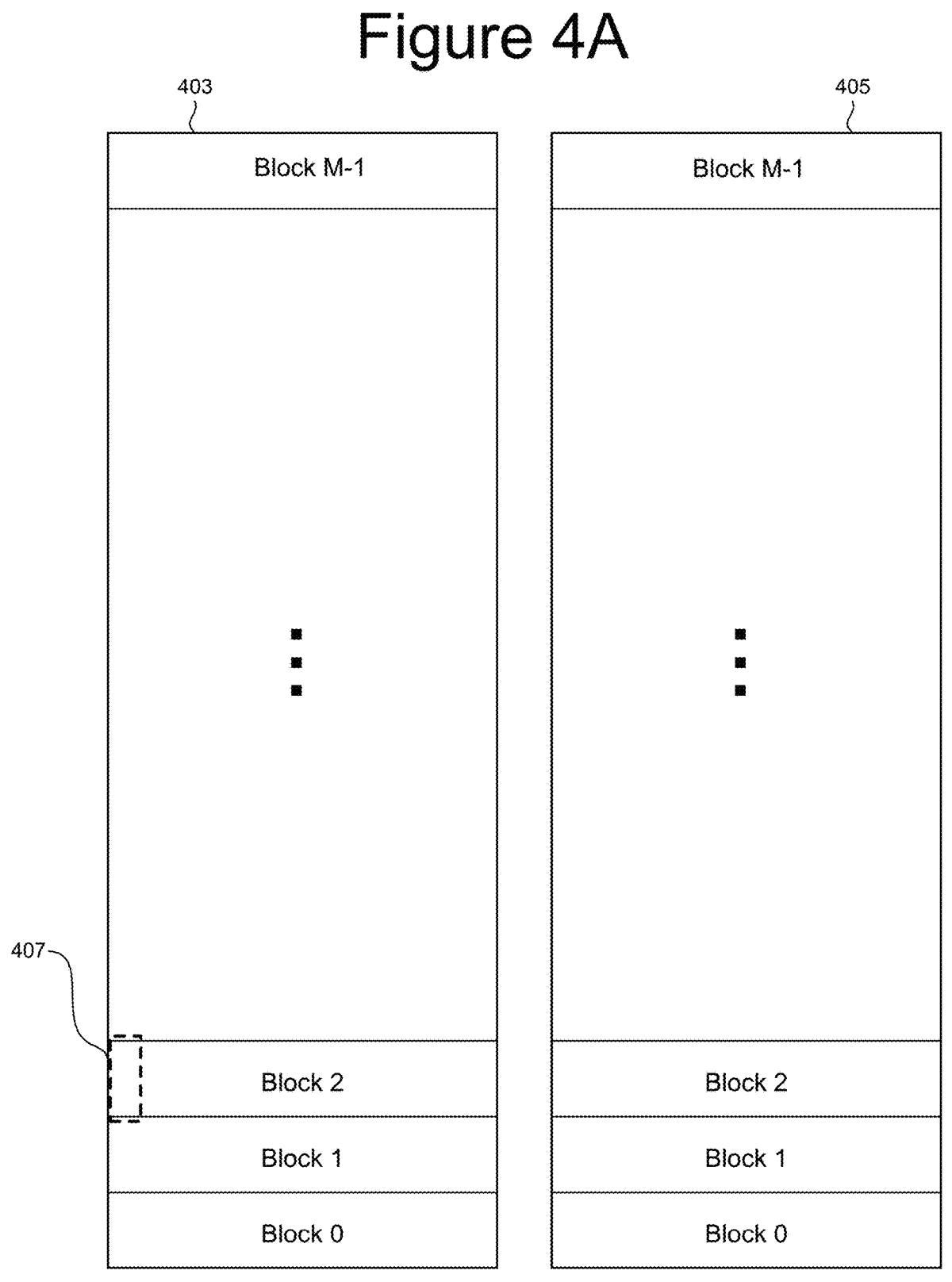

FIG. 4A is a block diagram explaining one example organization of memory structure 202, which is divided into two planes 403 and 405. Each plane is then divided into M physical blocks. In one example, each plane has about 2000 physical blocks. However, different numbers of physical blocks and planes can also be used. In one embodiment, a physical block of memory cells is a unit of erase. That is, all memory cells of a physical block are erased together. In other embodiments, physical blocks can be divided into sub-blocks and the sub-blocks can be the unit of erase. Memory cells can also be grouped into physical blocks for other reasons, such as to organize the memory structure to enable the signaling and selection circuits. In some embodiments, a physical block represents a group of connected memory cells as the memory cells of a block share a common set of word lines. For example, the word lines for a physical block are all connected to all of the vertical NAND strings for that physical block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
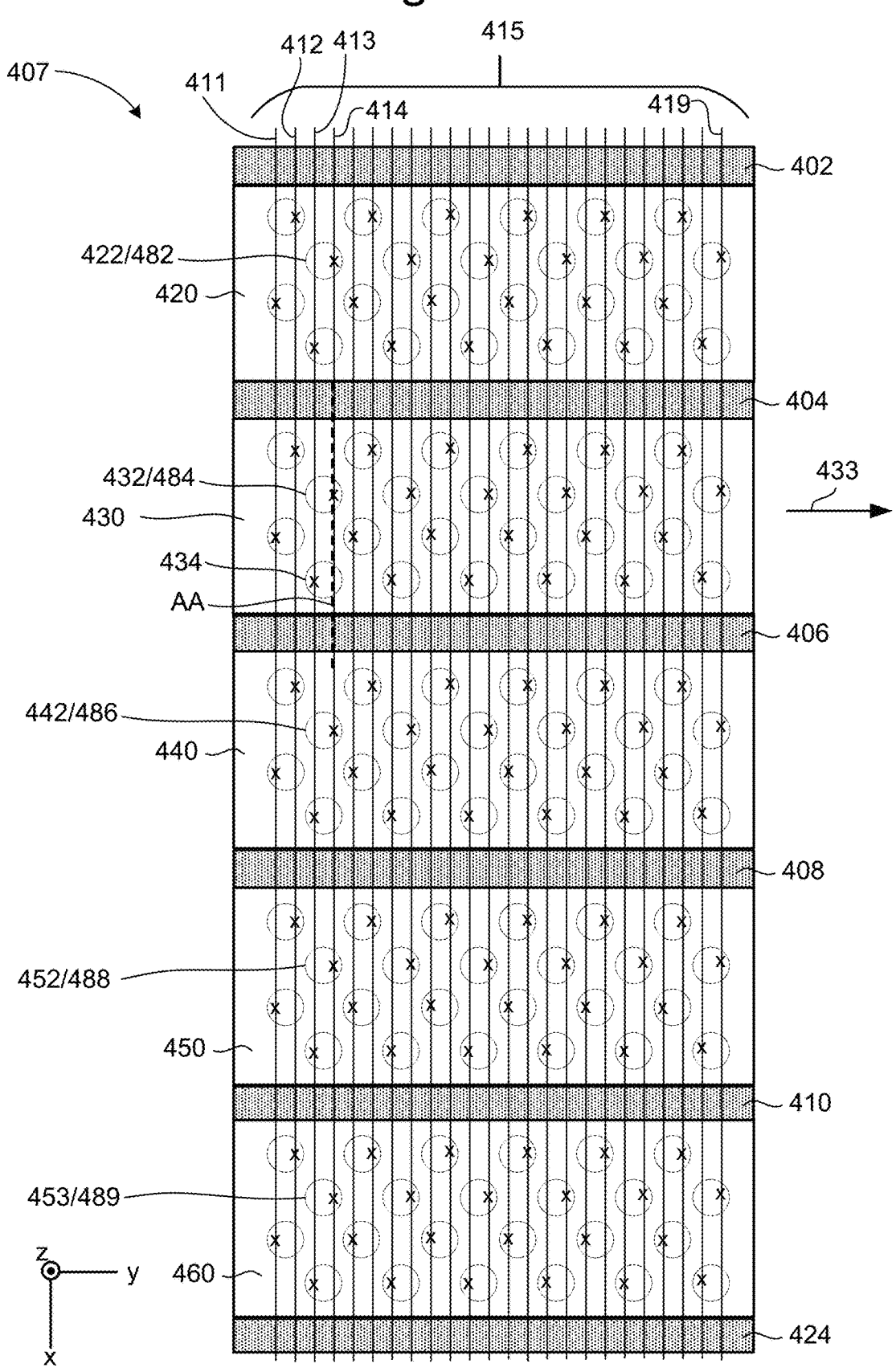
FIG. 4B is a block diagram depicting a top view of a portion of physical block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, 410, and 424, which are formed of SiO$_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the physical block 407 from adjacent physical blocks. Thus, isolation regions 402 and 424 may extend down to the substrate. In one embodiment, the isolation regions 404, 406, and 410 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/ NAND string in each of regions (sub-blocks) 420, 430, 440, 450, and 460. In that implementation, each physical block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
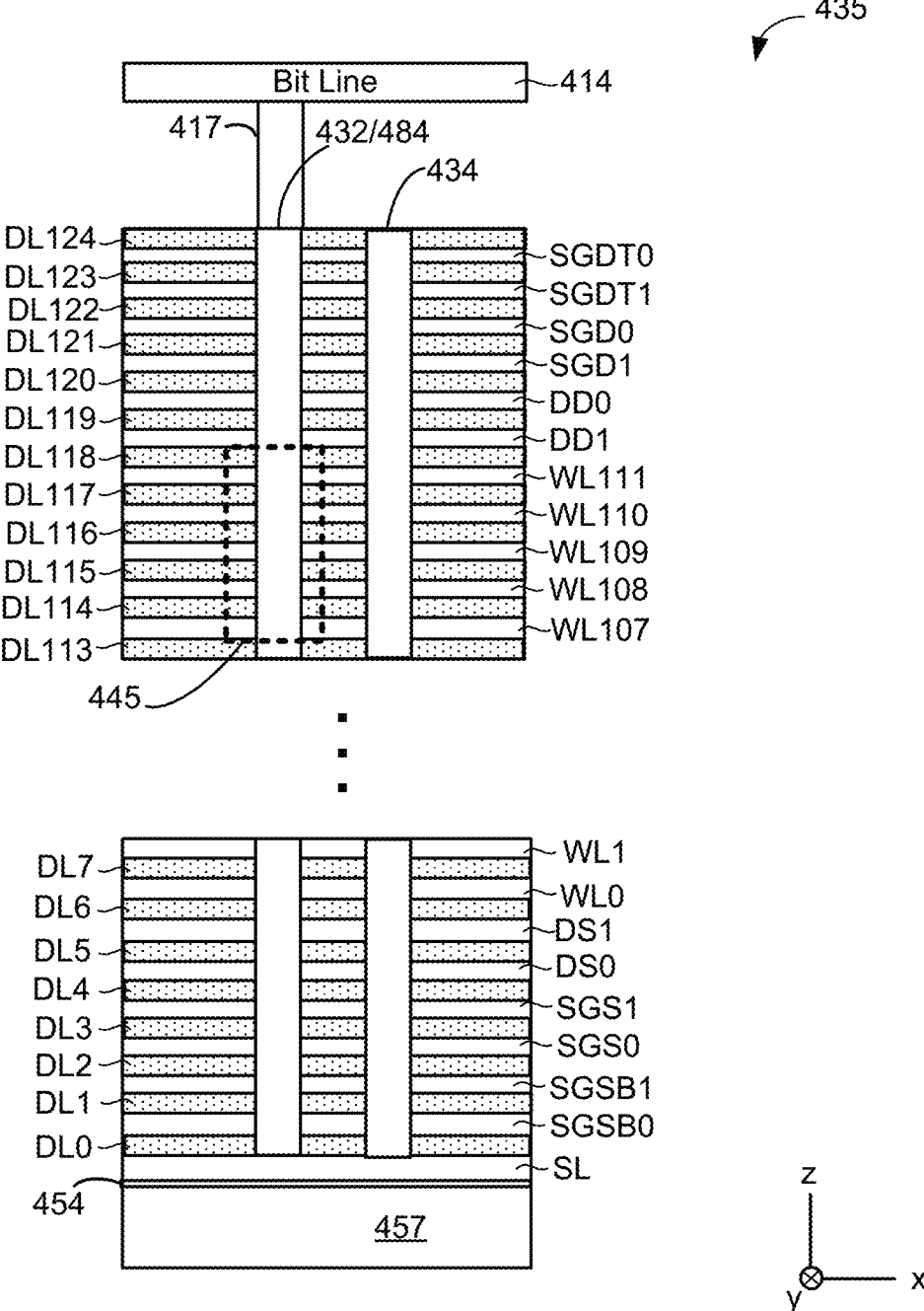
FIG. 4C depicts an example of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Four dummy word line layers DD0, DD1, DS1, and DS0 are provided, in addition to the data word line layers WL0-WL111. There may be more or fewer than 112 data word line layers and more or fewer than four dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

Figure 4D:
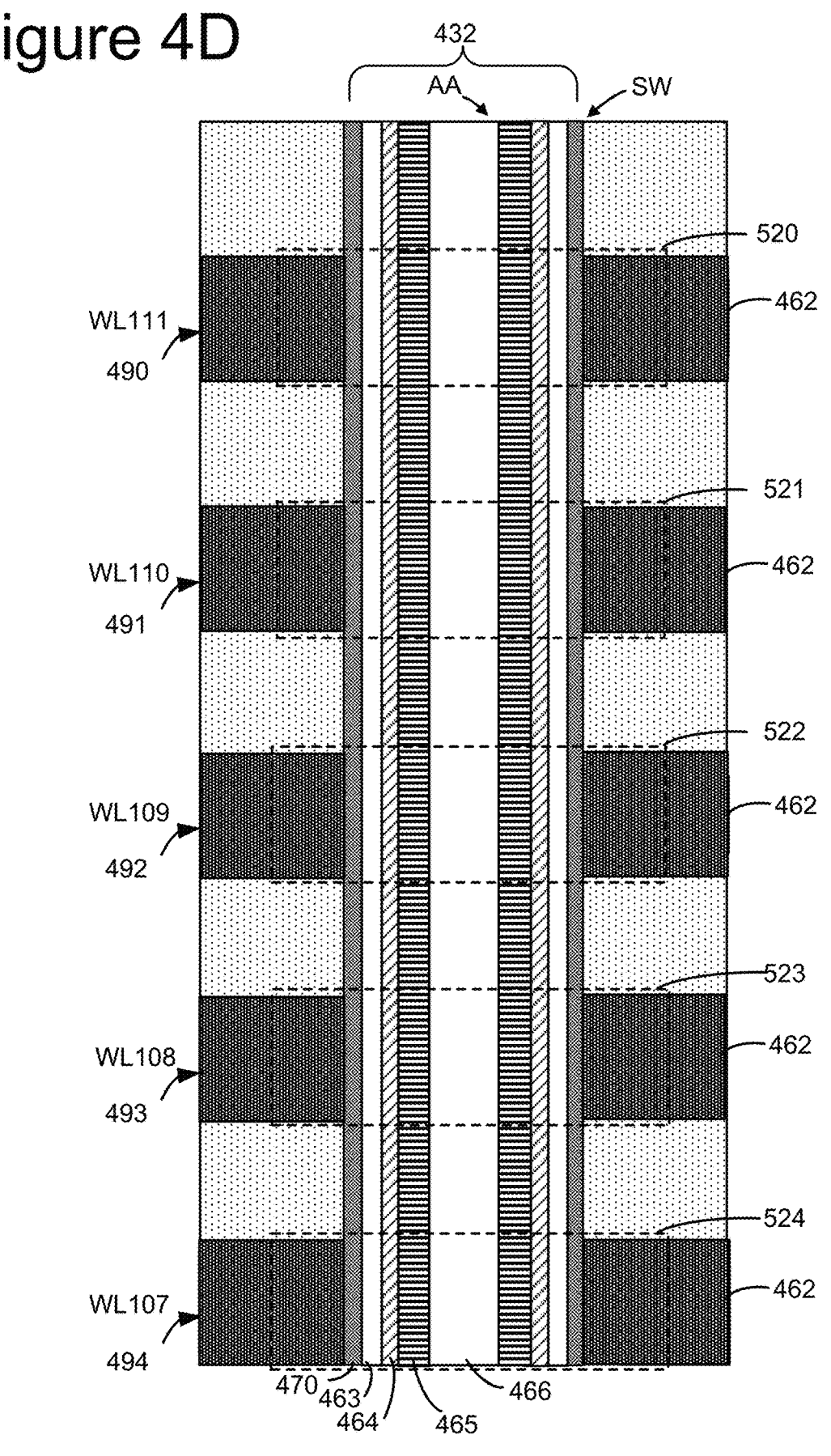
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
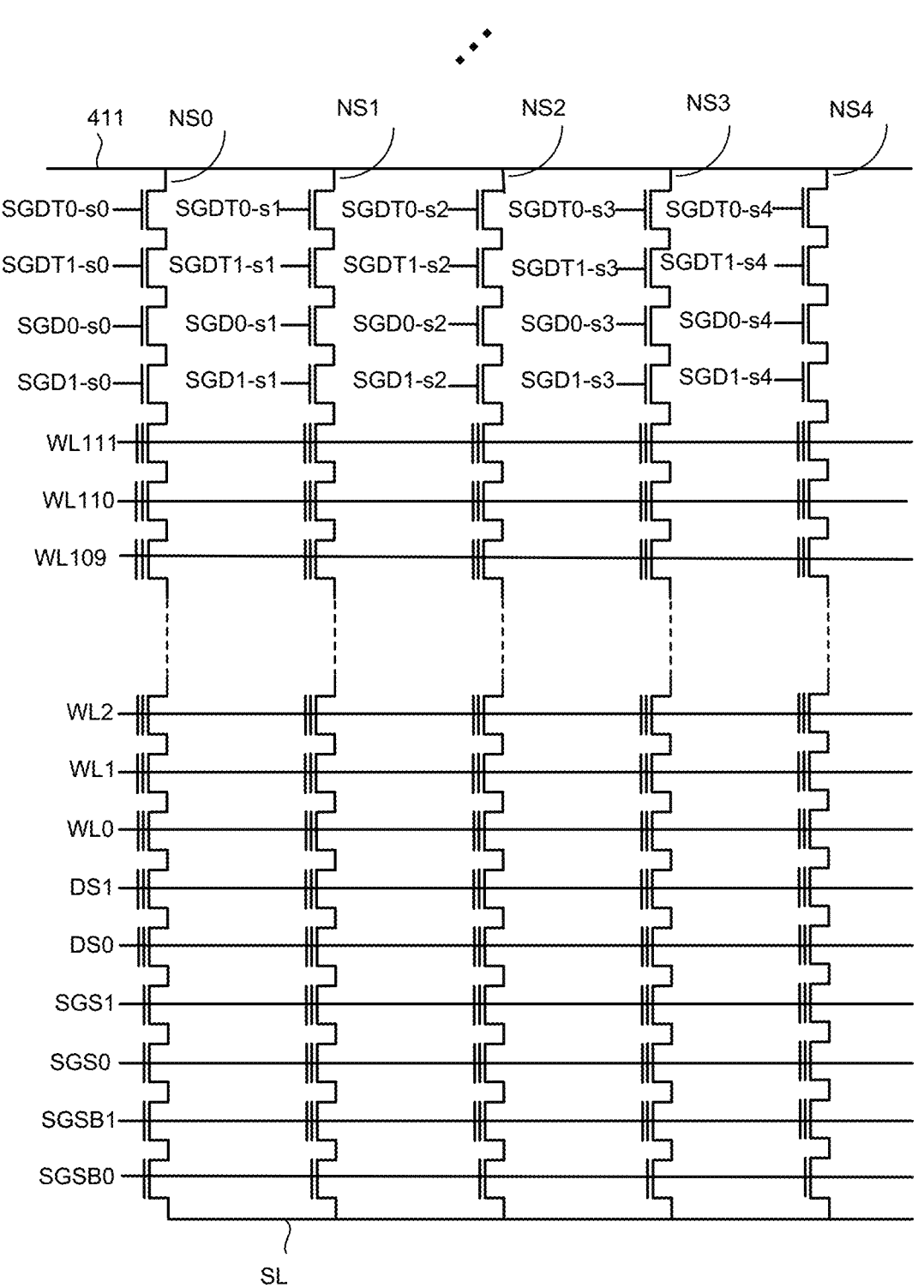
FIG. 4E is a schematic diagram of a portion of one example of a physical block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to five NAND strings. Thus, FIG. 4E shows bit line 411 connected to NAND string NS0, NAND string NS1, NAND string NS2, NAND string NS3, and NAND string NS4.

In one embodiment, there are five sets of drain side select lines in the physical block. For example, the set of drain side select lines connected to NS0 include SGDT0-s0, SGDT1-s0, SGD0-s0, and SGD1-s0. The set of drain side select lines connected to NS1 include SGDT0-s1, SGDT1-s1, SGD0-s1, and SGD1-s1. The set of drain side select lines connected to NS2 include SGDT0-s2, SGDT1-s2, SGD0-s2, and SGD1-s2. The set of drain side select lines connected to NS3 include SGDT0-s3, SGDT1-s3, SGD0-s3, and SGD1-s3. The set of drain side select lines connected to NS4 include SGDT0-s4, SGDT1-s4, SGD0-s4, and SGD1-s4. Herein the term "SGD" may be used as a general term to refer to any one or more of the lines in a set of drain side select lines. In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These five sets of drain side select lines correspond to five sub-blocks. A first sub-block corresponds to those vertical NAND strings controlled by SGDT0-s0, SGDT1-s0, SGD0-s0, and SGD1-s0. A second sub-block corresponds to those vertical NAND strings controlled by SGDT0-s1, SGDT1-s1, SGD0-s1, and SGD1-s1. A third sub-block corresponds to those vertical NAND strings controlled by SGDT0-s2, SGDT1-s2, SGD0-s2, and SGD1-s2. A fourth sub-block corresponds to those vertical NAND strings controlled by SGDT0-s3, SGDT1-s3, SGD0-s3, and SGD1-s3. A fifth sub-block corresponds to those vertical NAND strings controlled by SGDT0-s4, SGDT1-s4, SGD0-s4, and SGD1-s4. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a physical block is operated as an upper tier and a lower tier, wherein the upper tier and the lower tier each form an erase block. For example, memory cells connected to WL0-WL61 may be in the lower tier and memory cells connected to WL62-WL111 may be in the upper tier. Hence, memory cells connected to WL0-WL61 may be in one erase block and memory cells connected to WL62-WL111 may be in another erase block. A physical block could be operated in more than two tiers. Erase blocks can be formed based on other divisions of physical blocks.

Although the example memories of FIGS. 4-4E are three dimensional memory structure that includes vertical NAND strings with charge-trapping material, other 3D memory structures can also be used with the technology described herein.

Figures 5A, 5B:
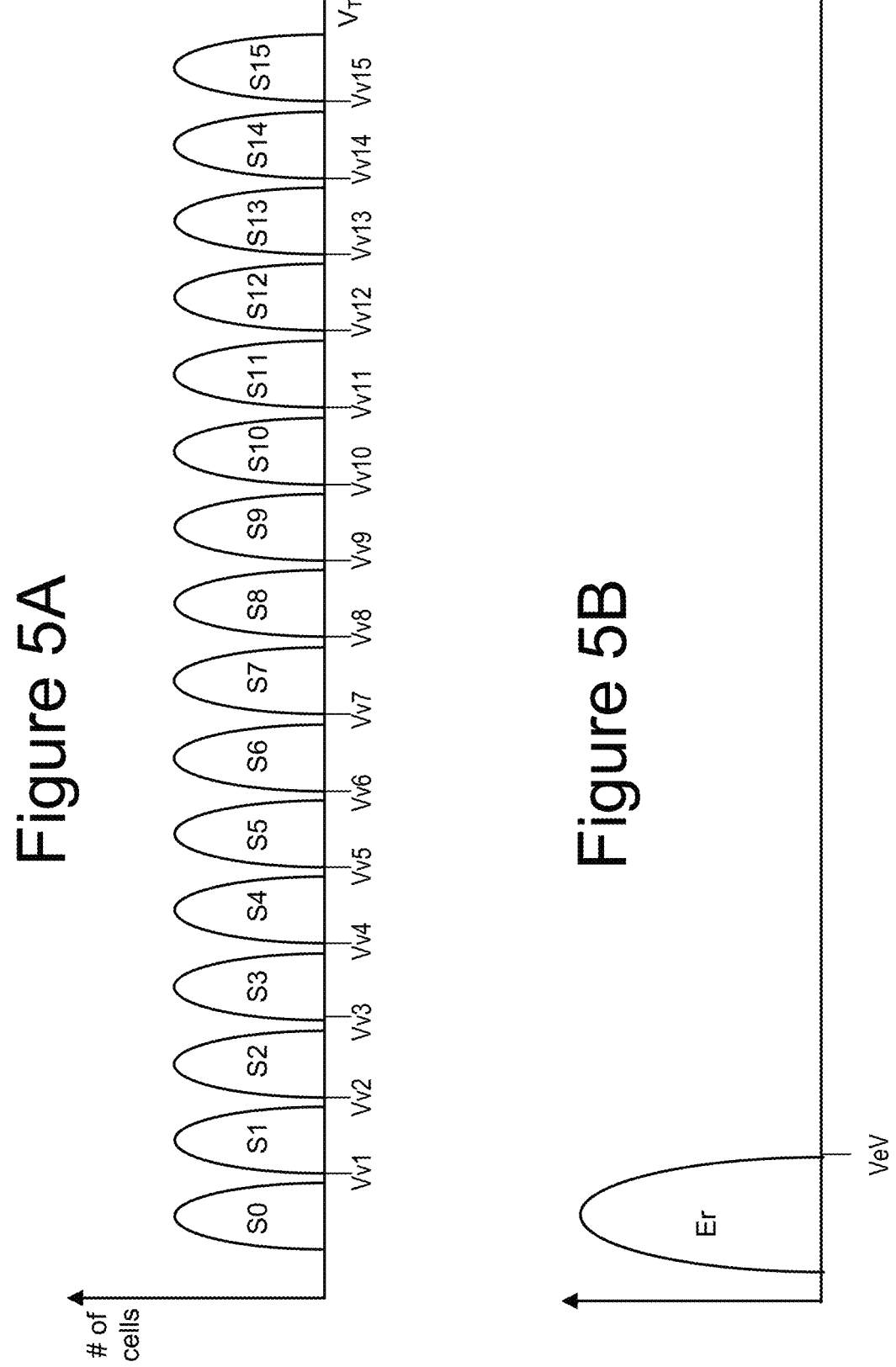
FIG. 5A depicts a threshold voltage (Vt) distributions when each memory cells stores four bits.
FIG. 5B depicts an example erase distribution (Er) for a physical page of memory cells.

The storage systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A depicts a threshold voltage (Vt) distributions when each memory cells stores four bits. There are sixteen data states (S0-S15). Memory cells are programmed from an erased state to one of 15 programmed states (S1-S15). There are 15 program verify voltages (Vv1-Vv15), with each program verify voltage used to verify one of the programmed states. For example, memory cells to be programmed to S1 have their Vt compared to Vv1, memory cells to be programmed to S2 have their Vt compared to Vv2, etc.

Prior to programming a group of memory cells that group is erased. The erase process will typically erase a large group of memory cells such as a block. Thus, the group that is erased may contain a large group of memory cells that contains many physical pages of memory cells. In in embodiment, an entire physical block of memory cells are erased together. However, in some cases only a portion of the physical block of memory cells are erased together. For example, only the upper tier of the block or only the lower tier of the block might be erased in the erase operation. The erase distribution (Er) for a physical page of memory cells is depicted in FIG. 5B. During an embodiment of erase, the Vt of the memory cells is verified with respect to an erase verify level (VeV). However, to pass erase it is not required that every memory cell have a Vt below VeV, as erase can pass so long as less than a pre-determined number of memory cells (or NAND strings) fail to pass erase verify.

One approach to erasing memory cells is to generate gate-induced drain leakage (GIDL) current to charge up the NAND string channel. An erase enable voltage is applied to control gates of the memory cells, while maintaining the string channel potential to erase the memory cells. The GIDL current is generated by causing a drain-to-gate voltage at a select transistor (drain side and/or source side), in one embodiment. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel 465, thereby raising the potential of the channel 465. The other type of carriers, e.g., electrons, are extracted from the channel 465, in the direction of a bit line or in the direction of a source line, by an electric field. During erase, the holes may tunnel from the channel to a charge storage region 463 of memory cells and recombine with electrons there, to lower the threshold voltage of the memory cells.

Figure 6:
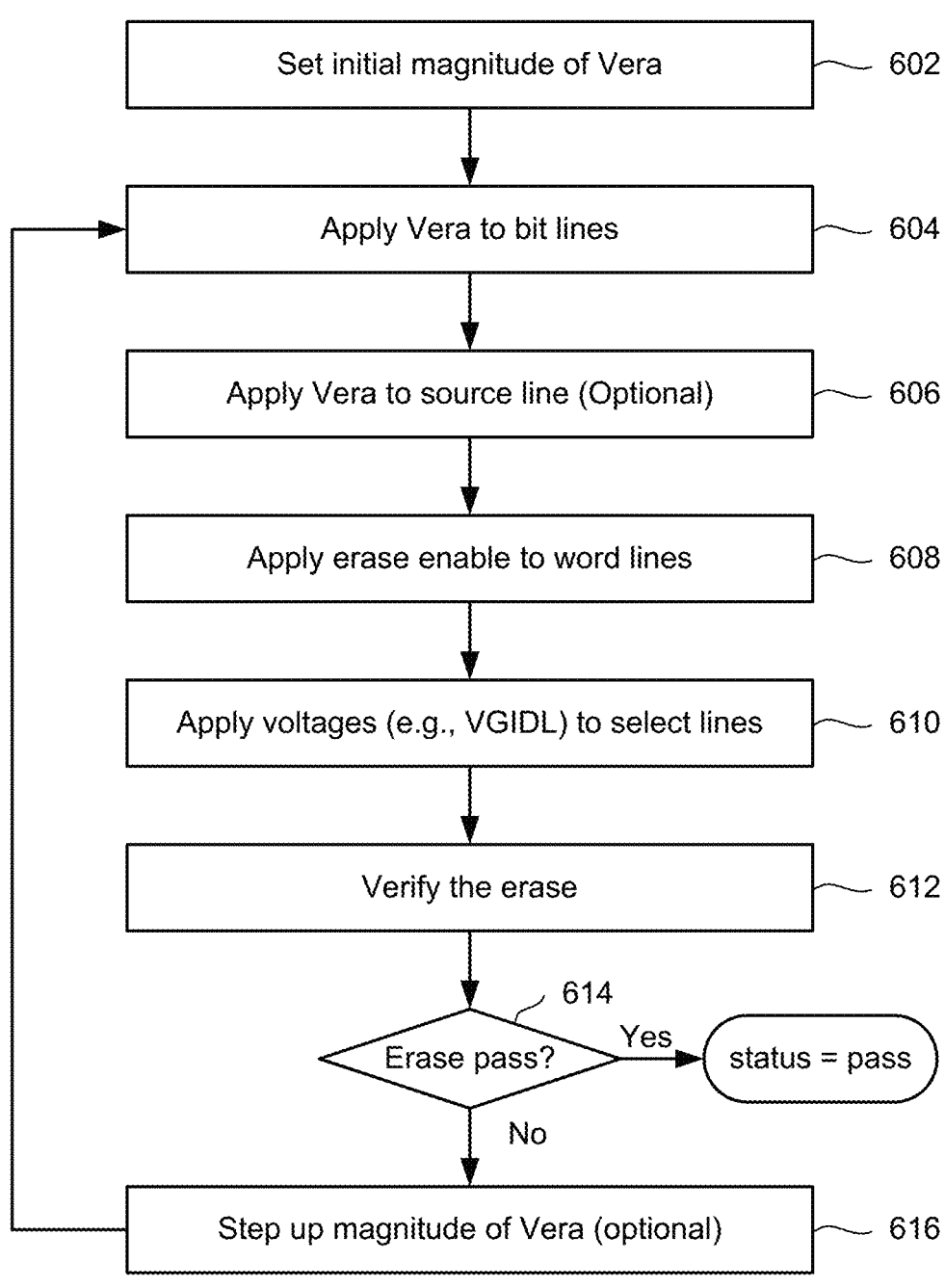
FIG. 6 is a flowchart describing one embodiment of a process for erasing memory cells.

FIG. 6 is a flowchart describing one embodiment of a process 600 for erasing memory cells. The process 600 may be used to erase an erase block of NAND memory cells. In one embodiment, the process 600 may be used to erase an entire physical block of NAND memory cells. In one embodiment, the process 600 may be used to erase a sub-block of the physical block of NAND memory cells. One type of sub-block are the sub-blocks selected by different drain side select lines such as in FIG. 4E. For example, the sub-block selected by SGDT0-s0, SGDT1-s0, SGD0-s0, and SGD1-s0 (more briefly referred to as SGD-s0) may be erased independent of the other four sub-blocks. Thus, in the example in FIG. 4E, there may be five sub-blocks selected by the respective SGDs. In an embodiment, system control logic 260 performs process 600 in response to a command from the memory controller 120. Process 600 describes a double sided erase in which an erase voltage (Vera) is applied at both ends of NAND strings (e.g., bit lines and source line). However, a single sided erase is also possible in which the erase voltage (Vera) is applied to only one end (e.g., bit line or source line) of the NAND strings. The steps of process 600 are described in a certain order to facilitate explanation. However, the steps could occur in a different order. Also, some of the steps may occur concurrently.

Step 602 includes setting an initial magnitude of an erase voltage (Vera). The initial Vera may have a relatively large magnitude such as, for example, 20V. Step 604 includes applying Vera to bit lines connected to the NAND strings in the erase block. Step 606 includes applying Vera to a source line connected to the NAND strings in the erase block. Step 606 is optional in that the erase could be a single sided erase in which Vera is provided only from the bit lines. In an alternative embodiment the Vera is provided only from the source line (not from the bit lines). Step 608 includes applying an erase enable voltage to the word lines in the erase block (e.g., the selected word lines connected to the selected memory cells). An erase enable voltage applied to a memory cell's control gate will enable erase of that cell if the erase voltage (e.g., Vera) is in the channel of that cell. In other words, the erase occurs as a result of the magnitude (and polarity) of the voltage between the control gate and the channel. In one embodiment, the erase enable voltage is 0V. Thus, a voltage of about 20V may occur between the channel and the control gate. Step 610 includes applying a voltage (herein referred to as a "GIDL voltage" or Vgidl) to select lines (e.g., SGD, SGS). The GIDL voltage allows Vera to pass to the NAND channels. The GIDL voltage has a suitable magnitude that, in combination with Vera, will generate a GIDL current. In an embodiment, GIDL current is generated at both the source end and the drain end of the NAND strings to pass the erase voltage to the channels of the memory cells. In an embodiment, GIDL current is generated at only one end of the NAND strings to pass the erase voltage to the channels of the memory cells. The GIDL current will be generated at the end of the NAND strings to which Vera is applied.

Thus, the erase of a memory cell includes applying an erase enable voltage (e.g., 0V) to the control gate of the memory cell while applying an erase voltage (e.g., about 20V) to a channel or body of the memory cell. An erase voltage is defined herein as a voltage applied to a channel or body of a memory cell that will erase the memory cell providing that the erase enable voltage is also applied to a control gate of that memory cell. A memory cell that has the erase voltage applied to its channel (body) may be inhibited from erase by applying an erase inhibit voltage to its control gate. An erase inhibit voltage (applied to a memory cell control gate) is defined herein as a voltage that will inhibit erase of a memory cell despite the erase voltage being applied to the channel (body) of that memory cell.

After steps 604-610 are performed, an erase verify may be performed in step 612. The erase verify may apply for example VeV (See FIG. 5B) to each data word line in the erase block. If all memory cells in the erase block on a given NAND string have a Vt below VeV then the NAND string will conduct a significant current. In some embodiments, if a NAND string passes erase of the NAND string may end at this point. Step 614 is a determination of whether erase is complete. If not the magnitude of the erase voltage (Vera) may optionally be increased in step 616. Thus, steps 604-614 are repeated. When all NAND strings have passed erase the process ends. In some embodiments, erase may end with a few NAND strings having yet to pass erase.

Figure 7:
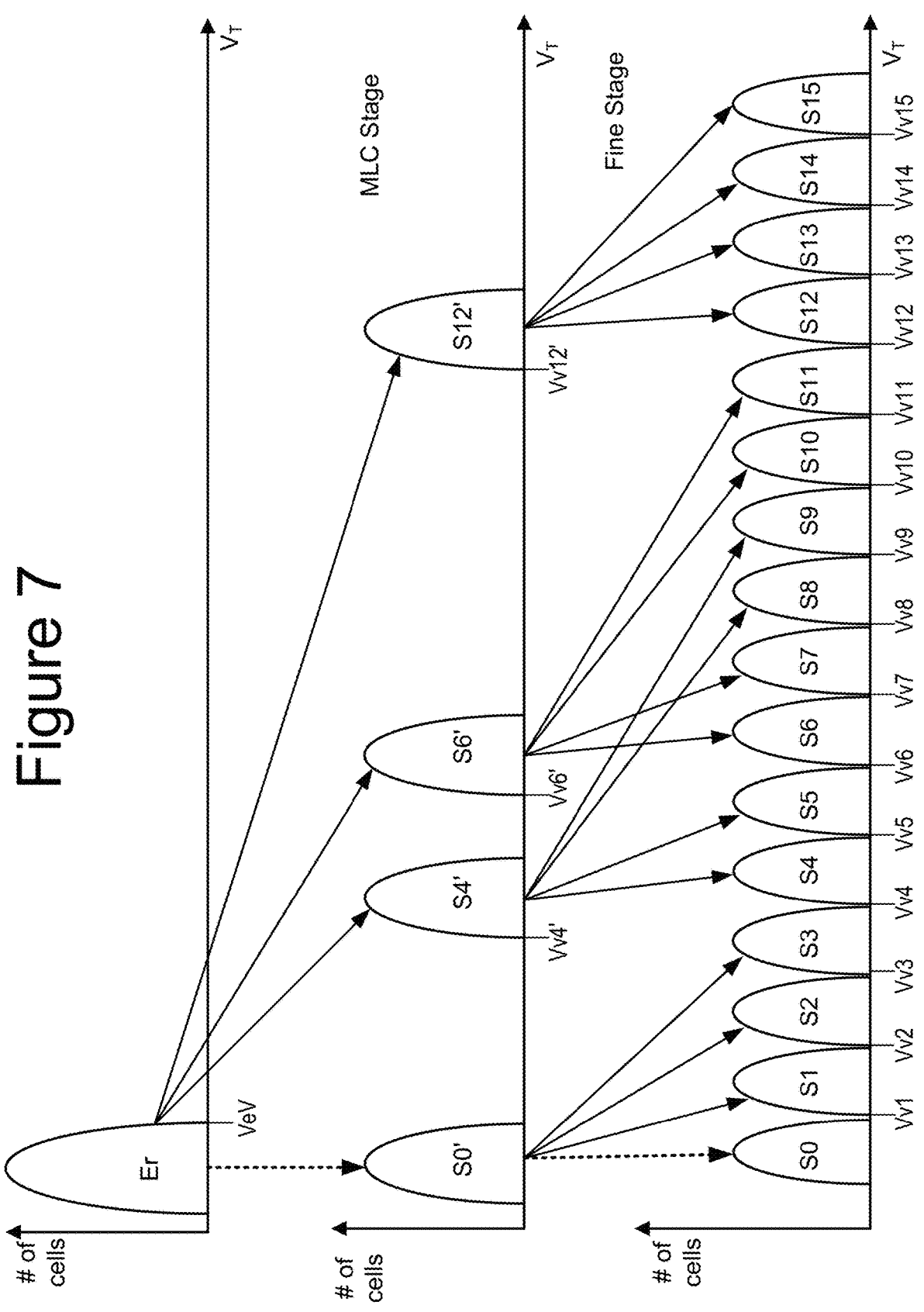
FIG. 7 depicts an example of Vt distributions during a two-stage programming process.

After the memory cells have been erased, the memory cells are programmed. Typically the cells are programmed in smaller units than the unit of erase. For example, the program unit could be the cells connected to one word line and controlled by the same SGD. For example, the cells connected to a selected word line in one sub-block may be programmed together. There are many different types of programming techniques. One programming technique will program cells in a single stage to their respective target data states. Another programming technique is a multi-stage process. FIG. 7 depicts an example of a two-stage programming process. The two-stage programming process may be used to program cells to four bits per cell. For example, two data pages may be programmed in the first stage (or MLC stage) and two additional data pages may be programmed in the second stage (or fine stage). A data page has one bit for each memory cell in the physical page. The data page itself may contain one or more ECC codewords. An ECC codeword is a unit that contains a number of parity bits and a number of ECC bits. In the example in FIG. 7, the MLC stage is used to program a lower page and a middle page into the physical page of memory cells. The four states (S0', S4', S6', and S12') correspond to the four possible bit patterns for two bits. Each memory cell will be programmed in the MLC stage to one of the four states (S0', S4', S6', or S12') depending on which lower page bit and which upper page bit are stored in that cell. Memory cells to be programmed to the S4' state are verified using verify reference voltage Vv4'. Memory cells to be programmed to the S6' state are verified using verify reference voltage Vv6'. Memory cells to be programmed to the S12' state are verified using verify reference voltage Vv12'. Memory cells that are targeted for the S0' state do not receive any programming in the MLC stage. In other words, the S0' cells are inhibited from programming. Note that a memory cell that is inhibited from programming could have its Vt increase (unintentionally) by a small amount.

In the example in FIG. 7, the fine programming stage is used to program an upper page and a top page into the physical page of memory cells. Memory cells that were in the S0' state are either programmed to one of the three data states (S1, S2, S3) or do not receive any programming such that they target the S0 state. Verify reference voltages Vv1, Vv2, and Vv3 are used to verify for the three respective data states (S1, S2, S3). Memory cells that were in the S4' state are programmed to one of the four data states (S4, S5, S8, S9). Verify reference voltages Vv4, Vv5, Vv8, and Vv9 are used to verify for the four respective data states (S4, S5, S8, and S9). Memory cells that were in the S6' state are programmed to one of the four data states (S6, S7, S10, S11). Verify reference voltages Vv6, Vv7, Vv10, and Vv11 are used to verify for the four respective data states (S6, S7, S10, and S11). Memory cells that were in the S12' state are programmed to one of the four data states (S12, S13, S14, S15). Verify reference voltage Vv12, Vv13, Vv14, and Vv15 are used to verify for the four respective data states (S12, S13, S14, and S15).

There are many alternatives to the sequence in FIG. 7. For example, the mapping of states from the MLC stage to the fine stage has other possibilities than depicted in FIG. 7. Also, other verify levels could be used for the MLC stage.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 7B, after the MLC stage each memory cell stores two bits of data. In the example embodiment of FIG. 7B, after the fine stage each memory cell stores four bits of data.

Figure 8:
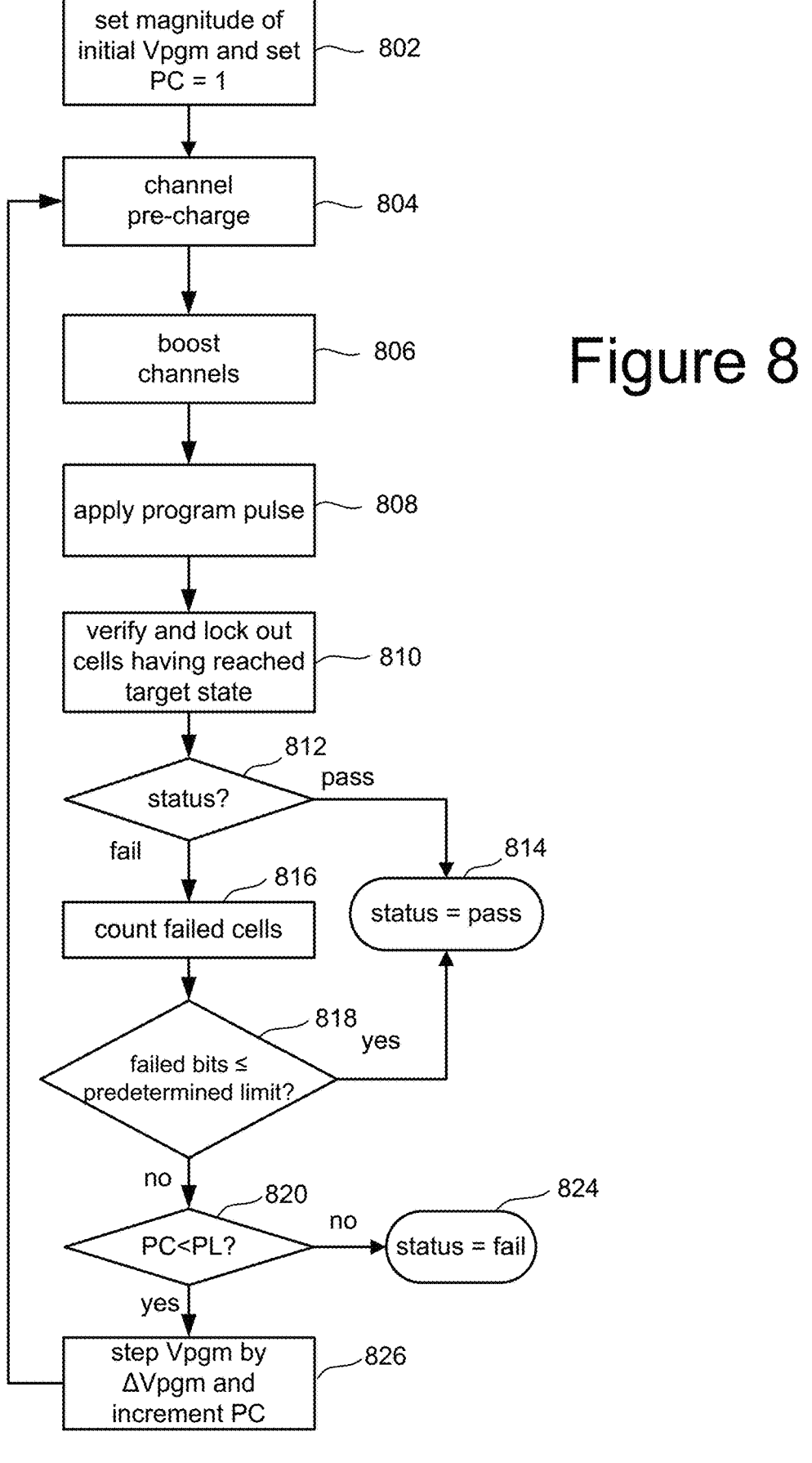
FIG. 8 is a flowchart describing one embodiment of a process for programming memory cells.

FIG. 8 is a flowchart describing one embodiment of a process for programming memory cells. For purposes of this document, the term program and programming are synonymous with write and writing. In one example embodiment, the process of FIG. 8 is performed for memory structure 202 using the one or more control circuits (e.g., system control logic 260, column control circuitry 210, row control circuitry 220) discussed above. In one example embodiment, the process of FIG. 8 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 8 may be performed to implement the multi-stage programming depicted in FIG. 7. When implementing multi-stage programming, the process of FIG. 8 is used to implement any/each stage of the multi-stage programming process. For example, the process of FIG. 8 could be performed once to perform the MLC stage and again to perform the fine stage of FIG. 7. The process of FIG. 8 is not limited to the example depicted in FIG. 7.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 802 of FIG. 8, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 804 the system will pre-charge channels of NAND strings that include memory cells connected to the selected word line that are to be inhibited from programming. In step 806, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 808, a program voltage pulse of the programming voltage Vpgm is applied to the selected word line (the word line selected for programming). If a memory cell on a NAND string should be programmed, then the corresponding bit line is biased at a program enable voltage. In step 808, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 810, program verify is performed and memory cells that have reached their target states are locked out from further programming. Step 810 includes performing verification of programming by sensing at one or more verify reference levels. In one embodiment, the verification process is performed by testing whether the threshold voltages of the memory cells selected for programming have reached the appropriate verify reference voltage. In some embodiments, the magnitude of the verify reference voltages will depend on whether programing will result in an open block. In step 810, a memory cell may be locked out after the memory cell has been verified (by a test of the Vt) that the memory cell has reached its target state. For example, a memory cell may be locked out if it reaches a verify reference voltage. In one embodiment, one or more data latches in the managing circuit 330 are used to indicate whether a memory cell is locked out or is to receive full programming.

If, in step 812, it is determined that all of the memory cells have reached their target threshold voltages (pass), the programming process is complete and successful because all selected memory cells were programmed and verified to their target states. A status of "PASS" is reported in step 814. Otherwise if, in step 812, it is determined that not all of the memory cells have reached their target threshold voltages (fail), then the programming process continues to step 816.

In step 816, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 818, it is determined whether the count from step 816 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 814. In this situation, enough memory cells programmed correctly such that the few remaining memory cells that have not been completely programmed can be corrected using ECC during the read process. In some embodiments, the predetermined limit used in step 818 is below the number of bits that can be corrected by error correction codes (ECC) during a read process to allow for future/additional errors. When programming fewer than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, then the programming process continues at step 820 and the program counter PC is checked against the program limit value (PL). Examples of program limit values include 8, 12, 16, 19, 20 and 30; however, other values can be used. If the program counter PC is not less than the program limit value PL, then the program process is considered to have failed and a status of FAIL is reported in step 824. If the program counter PC is less than the program limit value PL, then the process continues at step 826 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 826, the process loops back to step 804 and another program pulse is applied to the selected word line so that another iteration (steps 804-826) of the programming process of FIG. 8 is performed.

Figures 9A, 9B:
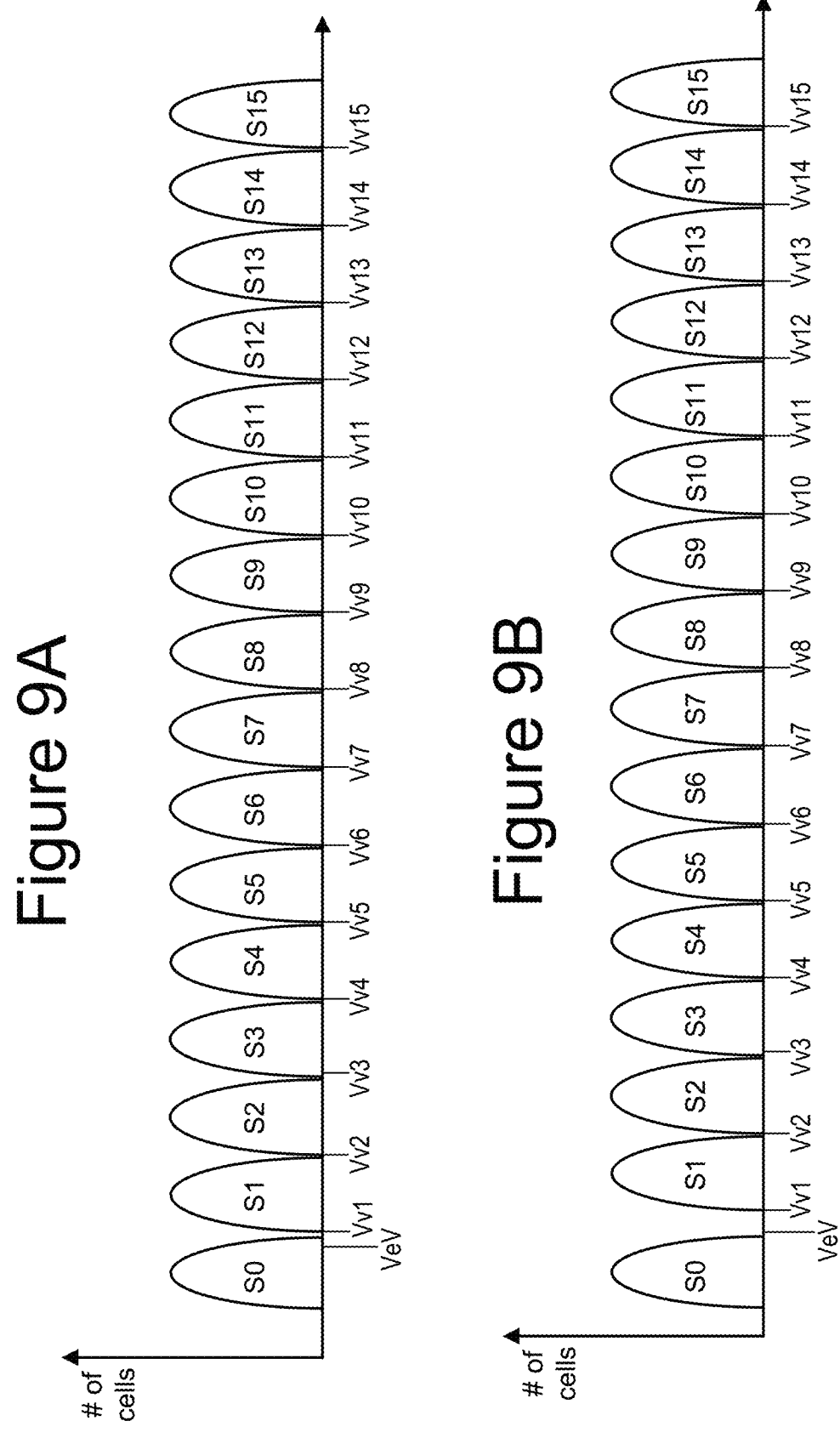
FIG. 9A depicts one possible set of Vt distributions after programming memory cells.
FIG. 9B depicts an example of the S0 state after an embodiment of a post-program erase of S0 cells.

FIG. 9A depicts one possible set of Vt distributions after programming memory cells. Note that the S0 state has some cells with a Vt greater than VeV. Recall that the erase procedure erased all, or at least nearly all, memory cells to a Vt below VeV. The cells that are in S0 did not receive any intentional programming in the programming process, but there may be an increase in the Vt of a significant number of the S0 cells. A change in Vt may be a result of an unintentional increase in the amount of charge stored in the erased memory cell even though the erased cell was inhibited from receiving any programming. Therefore, the gap between S0 and S1 may decrease. It is possible for some of the S0 cells to have a Vt above Vv1 after the programming process.

In one embodiment, the S0 cells are erased after the programming process, which lowers the Vt of all or most of the S0 cells. In an embodiment, the Vt may be lowered by about 0.3V to 0.5V. However, the Vt could be lowered by a smaller or greater amount. FIG. 9B depicts an example of the S0 state after the post-program erase of S0 cells. In order to avoid adding significant time to the overall program operation, in an embodiment the post-program erase does not perform an erase verify. Thus, the S0 cells may be erased regardless of whether their Vt is above or below VeV. In one embodiment, the post-program erase of S0 cells uses only a single erase pulse, which can save time while still improving the gap between S0 and S1. For example, steps similar to 602, 604, 608, 610 may be performed. Also, some additional steps to inhibit erase in the S1-S15 cells may be performed. In one embodiment, the duration of the erase pulse (e.g., Vera) is shorter during the post-program erase than during the pre-program erase, which can also save time while still improving the gap between S0 and S1. Further details of a post-program erase are described below.

FIG. 10A is a flowchart of one embodiment of a process 1000 of programming memory cells followed by a post-program erase. The process 1000 could be performed by one or more control circuits, such as, but not limited to, system control logic 260 (including one or more of state machine 262, power control 264, interface 268), and/or column control circuitry 210, row control circuitry 220. In one embodiment, the memory controller 120 instructs the system control logic 260 to perform process 1000. There may be different modes of operating the storage system 100, such that in one mode the post-program erase is performed and in another mode programming is performed without the post-program erase. Different techniques may be used for initiating the mode with the post-program erase. In one embodiment, the memory controller 120 sends a special command (or commands) to the die (e.g., memory die 200, control die 211) when sending the commands for the program operation. In one embodiment, the special commands are user defined commands permitted in the Open NAND Flash Interface (ONFI) Specification. However, the mode could be entered without ONFI commands or the like. In one embodiment, the mode for post-program erase is entered by a device parameter.

Step 1002 includes erasing a group of memory cells. In one embodiment, the memory cells reside on NAND strings in a three-dimensional memory structure. The memory cells could reside in any of the example structures depicted in FIG. 4, 4A, 4B, 4C, 4D, 4E, but are not limited thereto. In one embodiment, an entire block of memory cells are erased (e.g., Block 2 in FIG. 4A). However, a unit smaller than a block could be erased in step 1002. In one embodiment, process 600 is used to erase the group. As noted above, a block may be a group of NAND strings that share a set of common word lines. Step 1002 may include a verify step (e.g., step 612 in FIG. 6) to verify whether the cells are erased.

Step 1004 includes programming a first subset of the group from the erase state to programmed states. In one embodiment the first subset are those cells to be programmed from the erase state to a programmed state. There will be a second subset in the same physical region that will not receive programming. For example, the first subset could be those to be programmed to any of the S1 to S15 states. The second subset are referred to as the S0 cells. Thus, the first subset and second subset are in the same physical region, which in one embodiment is a selected word line in a subblock. A sub-block is a portion of a block that is controlled by one of the SGD. Thus, the first and second subsets could be, for example, those memory cells connected to WL2 in sub-block 0 (controlled by SGD0). In one embodiment, the process of FIG. 8 is used to program the first subset of memory cells. Herein a "subset" of a group of memory cells means less than all of the memory cells in the group.

Step 1006 includes applying an erase condition to the second subset of memory cells regardless of the Vt of the individual cells in the second subset. In an embodiment, the erase condition generates a GIDL current in selected NAND strings. In an embodiment, the erase condition creates an erase voltage from the channel to the control gate of memory cells selected for erase. However, the erase voltage will not be created from the channel to the control gate of memory cells that are not to be erased (e.g., inhibited from erase). In one embodiment, an erase voltage (e.g., Vera of about 20V) is applied to selected bit lines while applying a voltage to a selected SGD to create the GIDL currents in the selected NAND strings. An erase enable voltage (e.g., 0V to 0.5V) may be applied to a selected word line. Step 1006 may also include inhibiting erase in memory cells that are not selected for erase. Further details of the erase are described below.

FIG. 10B is a flowchart of one embodiment of a process 1050 of a bit level post-program erase in 3D NAND. The process 1050 may be used in one embodiment of step 1006 of process 1000. The process 1050 could be performed by one or more control circuits, such as, but not limited to, system control logic 260 (including one or more of state machine 262, power control 264, interface 268), and/or column control circuitry 210, row control circuitry 220. In one embodiment, the memory controller 120 instructs the system control logic 260 to perform process 1050. The steps of process 1050 may be performed in a different order than depicted in FIG. 10B. Also some steps could be performed concurrently.

Step 1052 includes applying an erase condition to S0 cells on a selected word line in a selected sub-block of a selected block. In one embodiment, an erase voltage (e.g., Vera of about 20V) is applied to selected bit lines while applying a voltage to a selected SGD of the selected block to create the GIDL currents in the selected NAND strings. An erase enable voltage (e.g., 0V to 0.5V) may be applied to a selected word line.

Step 1054 includes inhibiting erase of all programmed state cells (e.g., S1-S15) on the selected word line in the selected sub-block of the selected block. The programmed state cells are connected to the same word line and the same SGD as the memory cells being erased. However, the programmed state cells are on NAND strings connected to different bit lines than the NAND strings of cells to be erased. Therefore, the programmed state cells may be inhibited from erased by choice of the magnitude of the voltage applied there their (unselected) bit lines. In one embodiment, these unselected bit lines receive a voltage of about 7.6V below the erase voltage applied to the selected bit lines. However, a voltage greater or lower than 7.6V below the erase voltage may be used.

Step 1056 includes inhibiting erase of all other memory cells in the selected block. Step 1056 includes inhibiting erase of memory cells connected to all other word lines in the selected block (whether in the selected sub-block or not). In some embodiments, the magnitude of the voltage applied to unselected word lines is chosen to inhibit erase of such memory cells. In one embodiment, these unselected word lines receive a voltage of about 7.6V below the erase voltage applied to the selected bit lines. However, a voltage greater or lower than 7.6V below the erase voltage may be used. Step 1056 includes inhibiting erase of cells in all other sub-blocks in the selected block (whether connected to the selected WL or not). Further details of inhibiting erase of these other memory cells are discussed below. In some embodiments, the magnitude of the voltage applied to unselected SGD is chosen to inhibit erase of such memory cells in other sub-blocks. In one embodiment, at least some of the layers of the unselected SGD (e.g., SGDT0, SGDT1) receive a voltage of about the erase voltage applied to the selected bit lines. However, a voltage that is less than the erase voltage applied to the selected bit lines could be applied to the unselected SGD.

Figure 11:
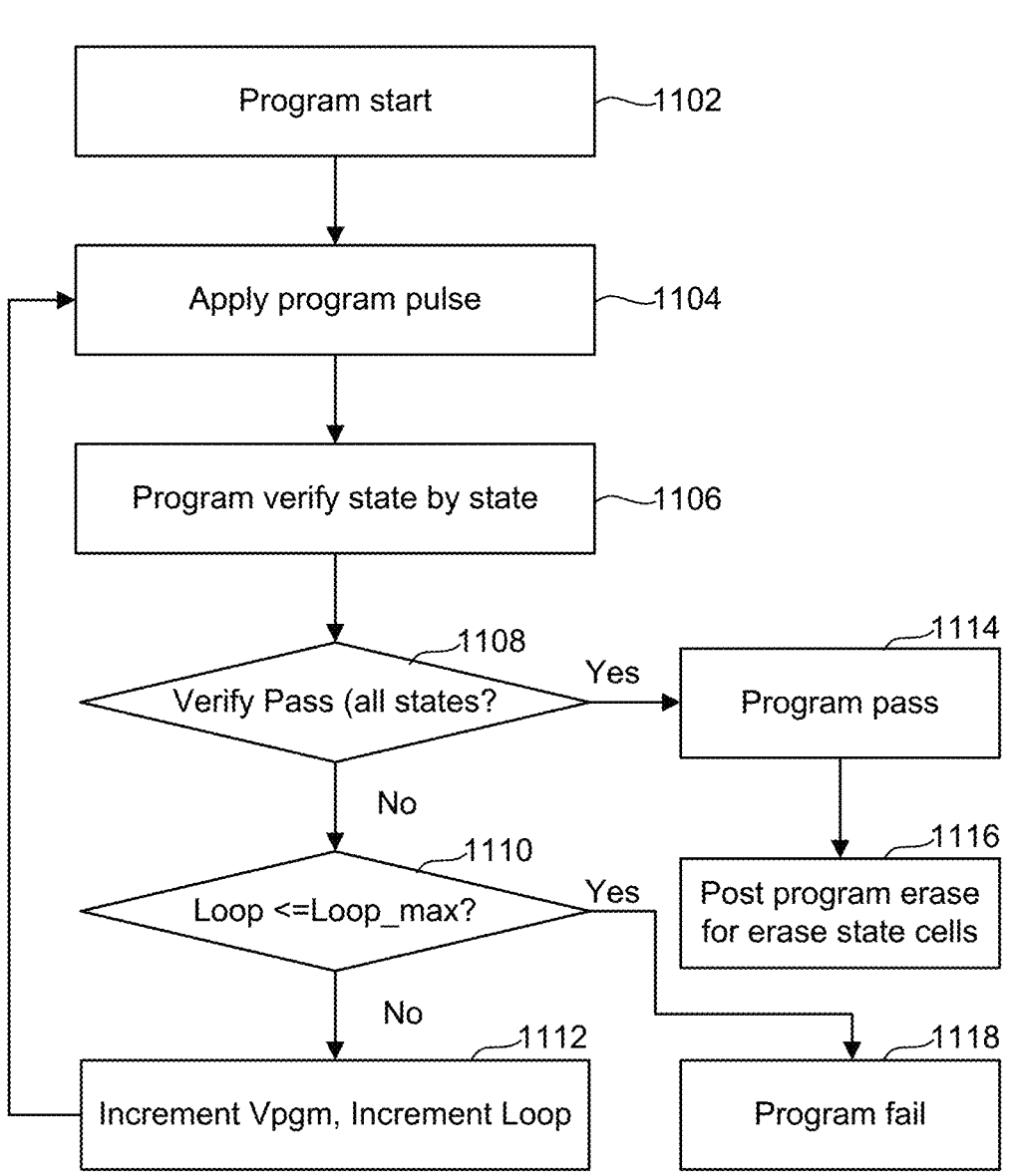
FIG. 11 is a flowchart that depicts additional details of a process of an embodiment of a program with a post-program erase.

FIG. 11 is a flowchart that depicts additional details of a process 1100 of a program with a post-program erase. The process 1100 may be used in one embodiment of steps 1004 and 1006 of process 1000. The process 1100 could be performed by one or more control circuits, such as, but not limited to, system control logic 260 (including one or more of state machine 262, power control 264, interface 268), and/or column control circuitry 210, row control circuitry 220. In one embodiment, the memory controller 120 instructs the system control logic 260 to perform process 1100. The steps of process 1100 may be performed in a different order than depicted in FIG. 11. Also some steps could be performed concurrently. Table I shows one example of a command sequence that the memory controller 120 may send to program with a post-program erase, although other techniques may be used. In the example program operation, the program operation is divided into a foggy stage and a fine stage that has the post-program erase mode. The example is consistent with the ONFI Specification, with CMD XX being a user defined command to perform the post-program erase.

TABLE I

| (Foggy program portion) |
| --- |
| 0D h-01 h-80 h-adddress (5 cycle)-data in-1 Ah => Busy –> Ready |
| 0D h-02 h-80 h-adddress (5 cycle)-data in-1 Ah => Busy –> Ready |
| 0D h-03 h-80 h-adddress (5 cycle)-data in-1 Ah => Busy –> Ready |
| 0D h-04 h-80 h-adddress (5 cycle)-data in-10 h => Busy –> Ready |
| (Fine portion with post-program erase mode) |
| Prefix CMD XX-01 h-80 h-adddress (5 cycle)-data in-1 Ah => Busy –> Ready |
| Prefix CMD XX-02 h-80 h-adddress (5 cycle)-data in-1 Ah => Busy –> Ready |
| Prefix CMD XX-03 h-80 h-adddress (5 cycle)-data in-1 Ah => Busy –> Ready |
| Prefix CMD XX-04 h-80 h-adddress (5 cycle)-data in-10 h => Busy –> Ready |

Step 1102 includes the start of the program operation. The program operation may start at the request of the memory controller 120. Step 1104 includes applying a program pulse (e.g., Vpgm). Step 1104 includes applying Vpgm to the selected word line with other conditions to the selected bit lines and unselected bit lines that will result in programming to selected memory cells but will not result in programming in unselected memory cells.

Step 1106 includes verifying the programming state by state. It is not required that each state be verified during each program loop. Step 1108 includes a determination of whether program verify for all states passed. If not, then the loop count is tested in step 1110. If the loop count is still less than or equal to the maximum (Loop_Max) then the process continues at step 1112. However, if the loop count exceeds Loop_max then the process ends with a status of program fail (step 1118), which may be reported to the memory controller 120. Step 1112 includes incremented the magnitude of Vpgm and the loop count. Then the process returns to steps 1104-1108. Assuming all states pass verify (step 1108), the programming passes with a state of program pass (step 1114). Step 1116 includes a post-program erase for the erase state (e.g., S0) cells.

Figure 13:
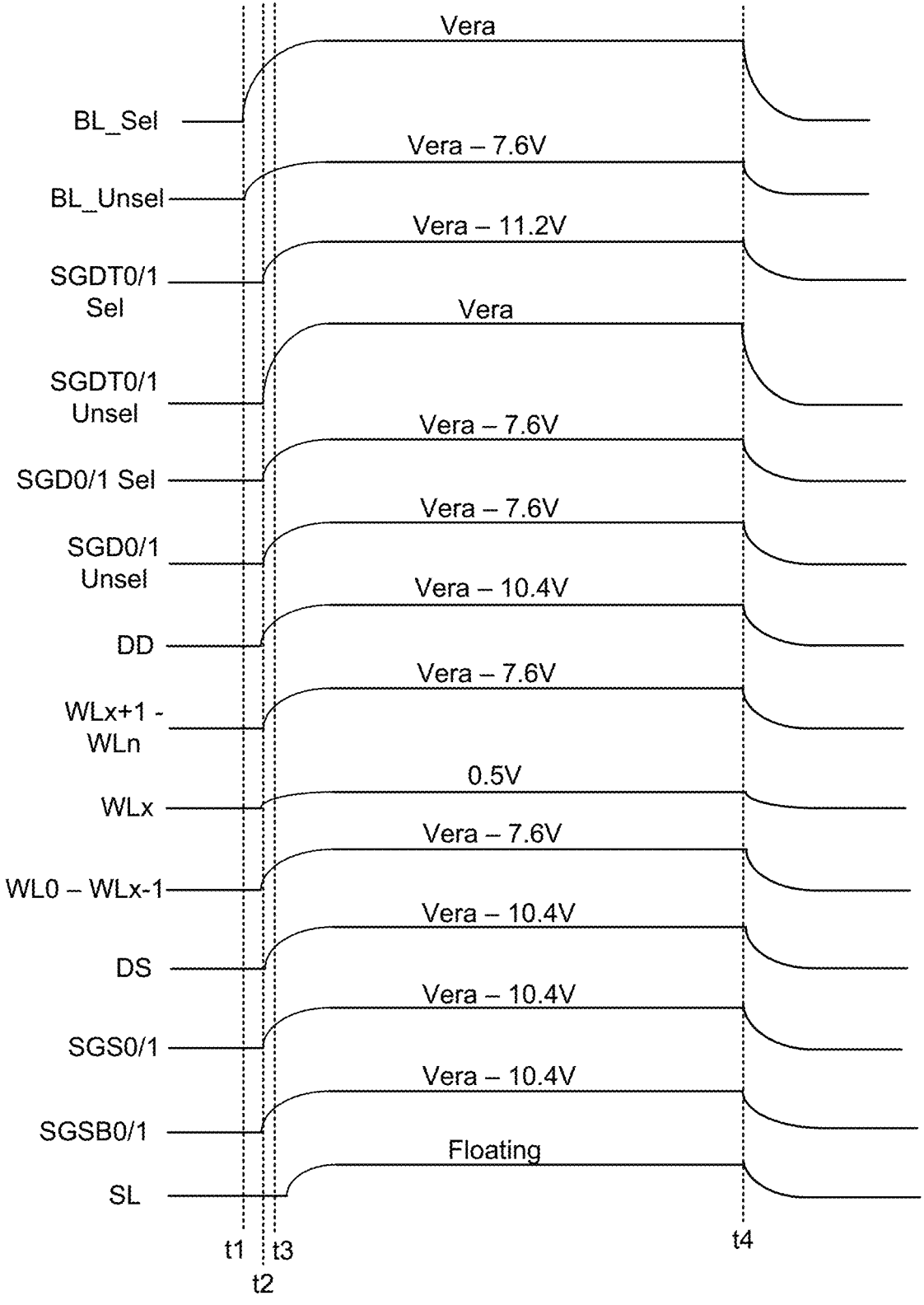
FIG. 13 is a timing diagram of voltages applied to the memory structure in one embodiment of a post-program bit-level erase in 3D NAND.

FIG. 12 is a flowchart of one embodiment of a process 1200 of bit-level erase in 3D NAND. The process 1200 may be used in step 1006 of process 1000, process 1050, and/or step 1116 in process 1100; however, process 1200 is limited thereto. The process 1200 could be performed by one or more control circuits, such as, but not limited to, system control logic 260 (including one or more of state machine 262, post-program erase circuitry 131, power control 264, interface 268), and/or column control circuitry 210, row control circuitry 220. In one embodiment, the memory controller 120 instructs the system control logic 260 to perform process 1200. FIG. 13 is a timing diagram of voltages applied to the memory structure in one embodiment of a FIG. 13 is a timing diagram of voltages applied to the memory structure in one embodiment post-program bit-level erase in 3D NAND. The post-program erase is not limited to the voltages depicted in FIG. 13. The timing diagram will be referred to when describing process 1200. The steps of process 1200 may be performed in a different order than depicted in FIG. 12. Also some steps could be performed concurrently.

Step 1202 includes applying an erase voltage (Vera) to selected bit lines. A selected bit line in the post-program erase is a bit line that is connected to a NAND string having a memory cell that is to receive the erase condition. The memory cells to receive the erase condition are connected to the selected word line (but not all memory cells connected to the selected word line will receive the erase condition). Step 1204 includes applying a voltage that is lower than the erase voltage to the unselected bit lines. An unselected bit line in the post-program erase is a bit line that is connected to one of the cells just programmed to a programmed state. Such programmed cells are to be inhibited from erase. Such programmed cells are in the selected sub-block and are connected to the selected word line. FIG. 13 shows that at time t1 the voltage on the selected bit lines (BL_Sel) begins to increase to Vera. Also, at time t1 the voltage on the unselected bit lines (BL_Unsel) begins to increase to Vera–7.6.

Step 1206 includes applying voltage(s) to the selected SGD to create a GIDL current in the selected NAND strings (a selected NAND string is connected to a selected bit line and is also in the selected sub-block). With reference to FIG. 13, at t2 the voltage on SGDT0/1 Sel begins to increase to Vera–11.2V. Also, at t2 the voltage on SGD0/1 Sel begins to increase to Vera–7.6V. The combination of the voltages applied to the control gates of the selected SGD transistors and the selected bit lines will generate a GIDL current in the selected NAND strings. In this example, the SGD layers have four layers (sec FIGS. 4C and 4E). In this example, Vera–11.2V is applied to the top two SGD lines (SGDT0, SGDT1). The next two lower SGD lines (SGD0, SGD1) each receive Vera–7.6V. In other embodiments, there will be a different number of SGD layers. Therefore, it will be understood by one of ordinary skill in the art that the generation of GIDL current is not limited to the example voltages in FIG. 13.

Step 1208 includes applying voltage(s) to the unselected SGD to prevent a GIDL current in the unselected NAND strings connected to the unselected SGD. Note that the NAND strings connected to the unselected SGD are in unselected sub-blocks. With reference to FIG. 13, at t2 the voltage on SGDT0/1 Unsel begins to increase to Vera. Also, at t2 the voltage on SGD0/1 Unsel begins to increase to Vera–7.6V. The combination of the voltages applied to the control gates of the unselected SGD transistors and either the selected bit lines or the unselected bit lines will not generate a GIDL current in the unselected NAND strings connected to the unselected SGD. For example, the drain to gate voltage difference between the voltage to and BL_sel and SGDT0/1 Unsel is given by: Vera–Vera=0V. The drain to gate voltage difference between the voltage to and BL_unsel and SGDT0/1 Unsel is given by: (Vera–7.6V)–Vera=–7.6V. Neither of these two conditions will create GIDL current in the unselected SGDT0/1. In one embodiment, the SGD layers have four layers (sec FIGS. 4C and 4E). In this example, Vera is applied to the top two unselected SGD lines (SGDT0, SGDT1). The next two lower SGD lines (SGD0, SGD1) each receive Vera–7.6V. The voltages applied to the control gates of unselected SGD0, SGD1 will not generate GIDL current.

Additionally, unselected NAND strings that are connected to the selected SGD will be inhibited from erase. These unselected NAND strings are in the selected sub-block, but are connected to unselected bit lines. The combination of voltages applied to the unselected bit lines and the selected SGD will not generate a GIDL current in these unselected NAND strings. For example, the bit line to SGDT0/1 voltage for such NAND strings will be given by: (Vera−7.6V)−(Vera−11.2V)=3.8V. A drain to gate voltage of 3.8V will be too low to generate a GIDL current. Furthermore, the voltage applied to the selected SGD0/1 will not result in GIDL current for such unselected NAND strings.

Referring again to FIG. 12, step 1210 includes applying an erase enable voltage (e.g., 0V to 0.5V) to the selected word line (WLx). Step 1212 includes applying an erase inhibit voltage to the unselected word line (WLx). Referring to FIG. 13 at t3, 0.5V is applied to WLx. Also, Vera−7.6V is applied to the unselected word lines (WLx+1 to WLn, and WL0 to WLx−1). Also, Vera−10.4V is applied to the dummy word lines (e.g., DD0, DD1, DS1, DS0).

The erase enable voltage (e.g., 0V to 0.5V) to the selected word line (WLx) will enable erase of selected memory cells, which may have a voltage of approximately Vera passed to their channels. Some of the unselected memory cells to be inhibited will have the erase enable voltage applied to their control gates. For example, a memory cell could be connected to the selected word line but also be on a NAND string connected to an unselected BL. Such an unselected memory cell will not have Vera passed to its channel (as a result of no GIDL generation for that unselected NAND string). The voltage across this memory cell will not be sufficient to erase the cell (or to program the cell). Some unselected memory cells will be on a selected NAND string, but will be connected to an unselected word line. Such cells may have a channel to control gate voltage of about: Vera−(Vera−7.6V)=7.6V. The channel to control gate voltage of 7.6V will not erase such as unselected memory cell.

Referring again to FIG. 12, step 1214 includes applying a voltage lower than Vera to SGS. Step 1216 includes floating the source line (SL). Referring to FIG. 13, the voltages to SGS0/1 and SGSB0/1 are both raised to Vera−10.4 V at t2. The source line voltage is floated at t3. At t4 the voltages on the various control lines are brought back down.

Figure 14:
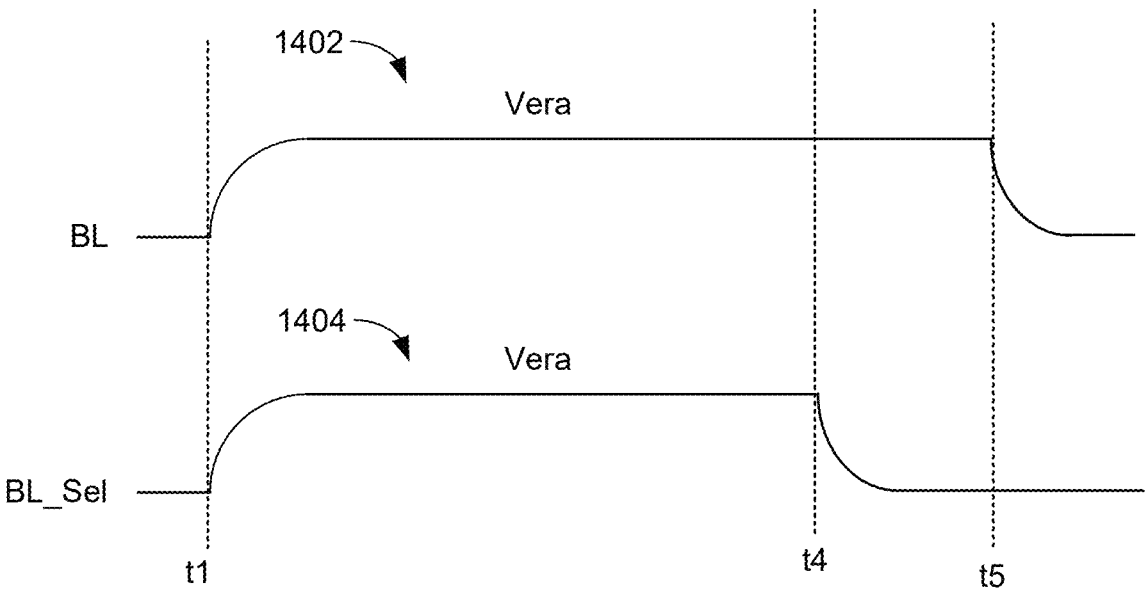
FIG. 14 depicts a post-program erase pulse having a shorter duration than an erase pulse used prior to programming.

FIG. 14 depicts a post-program erase pulse 1404 (applied to selected bit lines BL_Sel) having a shorter duration (t1 to t4) than a duration (t1 to t5) of an erase pulse 1402 (applied to bit lines BL) used prior to programming.

In view of the foregoing, a first embodiment includes an apparatus comprising one or more control circuits configured to connect to a three-dimensional memory structure comprising NAND strings having memory cells. The one or more control circuits are configured to erase a group of the memory cells to an erase state associated with an erase threshold voltage. The one or more control circuits are configured to program a first subset of the group of memory cells from the erase state to target data states associated with corresponding target threshold voltages, including inhibiting a second subset of the group of memory cells from programming from the erase state. The one or more control circuits are configured to apply an erase condition to the second subset of the memory cells following programming the first subset to lower the threshold voltage of memory cells in the second subset without regard to whether a pre-erase condition threshold voltage of respective memory cells in the second subset are above or below the erase threshold voltage.

In a further embodiment, the one or more control circuits are configured to inhibit erase in the first subset of the memory cells while applying the erase condition to the second subset.

In a further embodiment, the group of the memory cells includes all memory cells on a group of the NAND strings that are connected to a common set of word lines in the three-dimensional memory structure. The first subset of the memory cells and the second subset of the memory cells are all connected to a selected word line of the common set of word lines.

In a further embodiment, the one or more control circuits are configured to inhibit erase in unselected memory cells on the group of NAND strings that are connected to unselected word lines of the common set of word lines while applying the erase condition to the second subset of the memory cells.

In a further embodiment, the erase condition consists of a single erase voltage applied by the one or more control circuits between channel to control gate of the second subset of the memory cells.

In a further embodiment, the group of the memory cells comprises memory cells on NAND strings connected both to a common set of word lines and connected to a plurality of drain side select lines. The first subset of the memory cells and the second subset of the memory cells are all connected to both a selected word line of the common set of word lines and to a first drain side select line of the plurality of drain side select lines. The one or more control circuits are configured to inhibit erase of the memory cells on a set of the NAND strings connected both to the common set of word lines and to all other drain side select lines of the plurality of drain side select lines other than the first drain side select line.

In a further embodiment, the one or more control circuits are configured to apply an erase voltage to selected bit lines while applying a voltage to the first drain side select line to generate gate-induced drain leakage (GIDL) currents in selected NAND strings having the second subset of the memory cells. The one or more control circuits are configured to apply the erase voltage to all other drain side select lines of the plurality of drain side select lines other than the first drain side select line to prevent GIDL currents in unselected NAND prevent GIDL currents in unselected NAND strings while applying the erase voltage to the selected bit lines.

In a further embodiment, the one or more control circuits are configured to apply an erase voltage having a first duration to the group of the memory cells while erasing the group to the erase state. The one or more control circuits are configured to apply an erase voltage having a second duration that is shorter than the first duration to the second subset of the memory cells while erasing the second subset following programming the first subset.

In a further embodiment, the one or more control circuits are configured to generate a gate-induced drain leakage (GIDL) current in selected NAND strings having the second subset of the memory cells order to create the erase condition. The one or more control circuits are configured to float a source line connected to NAND strings having the group of the memory cells while generating the GIDL currents in the selected NAND strings.

In a further embodiment, the one or more control circuits are configured to program the first subset of the memory cells from the erase state to at least 15 target data states, the target data states associated with different target threshold voltages.

In a further embodiment, the one or more control circuits are configured to program the first subset of the memory cells from the erase state to at least 31 target data states, the target data states associated with different target threshold voltages.

One embodiment includes a method of operating three-dimensional NAND memory. The method comprises erasing a group of memory cells connected to a plurality of word lines to an erase state associated with an erase threshold voltage, wherein the plurality of word lines are connected to a group of NAND strings. The method comprises programming a first subset of memory cells of the group from the erase state to target threshold voltages associated with corresponding data states, wherein the first subset are connected to a selected word line of the plurality of word lines. The method comprises inhibiting programming of a second subset of memory cells of the group while programming the first subset, wherein the second subset are connected to the selected word line. The method comprises applying a single erase voltage to the second subset of the memory cells after programming the first subset to lower threshold voltages of respective memory cells in the second subset.

One embodiment includes a non-volatile storage system comprising a three-dimensional memory structure comprising blocks comprising NAND strings having memory cells. Each block comprising word lines. Each word line of a block connected to each NAND string in the block. The non-volatile storage system comprises first erase means for erasing memory cells in a selected block to an erase state. The erase state is associated with an erase threshold voltage. The non-volatile storage system comprises program means for programming a first subset of the memory cells connected to a selected word line in the selected block from the erase state to target data states. Each target data state is associated with a threshold voltage that is greater than the erase threshold voltage. The non-volatile storage system comprises post-program erase means for applying an erase voltage to a second subset of the memory cells connected to the selected word line to lower the threshold voltage of respective memory cells in the second subset after the first subset of the memory cells are programmed to the target data states. Prior to applying the erase voltage the second subset contains memory cells having a threshold voltage above the erase threshold voltage and memory cells having a threshold voltage below the erase threshold voltage.

In an embodiment, the first erase means comprises one or more of system control logic 260, state machine 262, power control 264, column control circuitry 210, row control circuitry 220, an FPGA, an ASIC, and/or an integrated circuit. In one embodiment, the first erase means performs process 600.

In an embodiment, the program means comprises one or more of system control logic 260, state machine 262, power control 264, column control circuitry 210, row control circuitry 220, an FPGA, an ASIC, and/or an integrated circuit. In one embodiment, the program means performs the process depicted in FIG. 8. In one embodiment, the program means performs steps 1102-1114 of process 1100.

In an embodiment, the post-program erase means comprises one or more of post-program erase circuitry 131, system control logic 260, state machine 262, power control 264, column control circuitry 210, row control circuitry 220, an FPGA, an ASIC, and/or an integrated circuit. In one embodiment, the post-program erase means performs process 1050. In one embodiment, the post-program erase means performs process 1200.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:

one or more control circuits configured to connect to a three-dimensional memory structure comprising blocks, each block having a stack of alternating dielectric layers and conductive layers, each block having NAND strings extending through the alternating dielectric layers and conductive layers, the conductive layers including word lines and a drain side select layer, each NAND string having memory cells and a drain side select transistor, for each block each word line connects to one memory cell on each NAND string in the block, each block divided into sub-blocks with each sub-block having a group of the NAND strings, each sub-block in a particular block having a drain side select line in the drain side select layer of the particular block, wherein for each sub-block the drain side select line connects to the drain side select transistor on each NAND string in the sub-block, the three-dimensional memory structure having bit lines associated with the NAND strings in the blocks, wherein the one or more control circuits are configured to:

erase the memory cells in a selected block to an erase state associated with an erase threshold voltage, including apply a first erase voltage pulse to the bit lines associated with the NAND strings of the selected block while applying a voltage to the drain side select lines of the selected block to create gate-induced drain leakage (GIDL) currents in the NAND strings of the selected block and while applying a non-negative erase enable voltage to the word lines of the selected block;

program a first group of memory cells on a selected word line in a selected sub-block of the selected block from the erase state to target data states associated with corresponding target threshold voltages, including inhibiting a second group of memory cells on the selected word line in the selected sub-block from programming from the erase state and inhibiting a third group of memory cells on the selected word line in unselected sub-blocks in the selected block from programming, the first group of memory cells residing on a first group of the NAND strings in the selected sub-block, the second group of memory cells residing on a second group of the NAND strings in the selected sub-block, the third group of memory cells residing on a third group of NAND strings in the unselected sub-blocks; and apply erase conditions to the second group of the memory cells in the selected sub-block while inhibiting erase of all other memory cells in the selected block following programming the first group of the memory cells to lower the threshold voltage of memory cells in the second group without regard to whether a pre-erase condition threshold voltage of respective memory cells in the second group are above or below the erase threshold voltage, including apply a second erase voltage pulse to selected bit lines associated with the second group of the NAND strings in the selected sub-block while applying a GIDL voltage to the drain side select line of the selected sub-block to create GIDL currents in the second group of the NAND strings and while applying the non-negative erase enable voltage to the selected word line, wherein inhibiting erase of all other memory cells in the selected block includes applying a voltage that is less than a magnitude of the second erase voltage pulse to unselected bit lines associated with the first group of NAND strings while applying a voltage greater than the GIDL voltage to unselected drain side select lines of the unselected sub-blocks, wherein a first plurality of the NAND strings in the unselected sub-blocks are associated with the selected bit lines and a second plurality of the NAND strings in the unselected sub-blocks are associated with the unselected bit lines.

2. The apparatus of claim 1, wherein the voltage applied by the one or more control circuits to the unselected drain side select lines of the unselected sub-blocks has a magnitude of approximately the second erase voltage pulse, wherein a combination of the voltages applied to the unselected bit lines and the drain side select line of the selected sub-block does not create GIDL current in the first group of NAND strings, wherein a combination of the voltages applied to the selected bit lines and the unselected drain side select lines does not create GIDL current in the first plurality of the NAND strings in the third group of NAND strings, wherein a combination of the voltages applied to the unselected bit lines and the unselected drain side select lines does not create GIDL current in the second plurality of the NAND strings in the third group of NAND strings.

3. The apparatus of claim 1, wherein the one or more control circuits are configured to:

inhibit erase of unselected memory cells that are connected to unselected word lines in the selected block while applying the erase condition to the second group of the memory cells.

4. The apparatus of claim 1, wherein the erase conditions include a single application of the second erase voltage pulse to the selected bit lines.

5. The apparatus of claim 1, wherein the one or more control circuits are configured to:

float a source line connected to the NAND strings in the selected block while applying the erase conditions to the second group of the memory cells.

6. The apparatus of claim 1, wherein the one or more control circuits are configured to:

program the first group of the memory cells from the erase state to at least 15 target data states, the target data states associated with different target threshold voltages.

7. The apparatus of claim 1, wherein:

the drain side select line in each sub-block is a first drain side select line in a first drain side select layer of the conductive layers and is connected to a first drain side select transistor on each NAND string in the sub-block;

each sub-block further includes a second drain side select line in a second drain side select layer of the conductive layers and is connected to a second drain side select transistor on each NAND string in the sub-block; and the one or more control circuits are further configured to apply substantially the same voltage to the second drain side select line in all sub-blocks in the selected block while applying the erase conditions to the second group of the memory cells in the selected sub-block while inhibiting erase of all other memory cells in the selected block.

8. The apparatus of claim 1, wherein:

the drain side select line in each sub-block is a first drain side select line in a first drain side select layer of the conductive layers and is connected to a first drain side select transistor on each NAND string in the sub-block;

each sub-block further includes a second drain side select line in a second drain side select layer of the conductive layers and is connected to a second drain side select transistor on each NAND string in the sub-block; and the one or more control circuits are further configured to apply substantially the same voltage to the second drain side select line in the selected sub-block and to the unselected bit lines associated with the first group of NAND strings while applying the erase conditions to the second group of the memory cells in the selected sub-block while inhibiting erase of all other memory cells in the selected block.

9. The apparatus of claim 8, wherein the one or more control circuits are further configured to apply the substantially the same voltage to the second drain side select line in the unselected sub-blocks and to the unselected bit lines associated with the first group of NAND strings while applying the erase conditions to the second group of the memory cells in the selected sub-block while inhibiting erase of all other memory cells in the selected block.

10. A method of operating three-dimensional NAND memory, the method comprising:

erasing a group of memory cells in a selected block in the three-dimensional NAND memory, to an erase state associated with an erase threshold voltage, wherein the selected block has word lines and NAND strings, each NAND string in the selected block having memory cells and a drain side select transistor, each word line connecting to one memory cell on each NAND string in the selected block, the selected block divided into sub-blocks with each sub-block having a group of the NAND strings, each sub-block having a drain side select line connected to the drain side select transistor on each NAND string in the sub-block, including applying a first erase voltage pulse to bit lines associated with the NAND strings in the selected block while applying a voltage to the drain side select lines of the selected block to create gate-induced drain leakage (GIDL) currents in the NAND strings of the selected block and while applying a non-negative erase enable voltage to the word lines of the selected block;

programming a first group of memory cells on a selected word line in a selected sub-block of the selected block from the erase state to target threshold voltages associated with corresponding data states, wherein the first group of memory cells reside on a first group of the NAND strings in the selected sub-block and are connected to a selected word line of the word lines in the selected block;

inhibiting programming of a second group of memory cells on the selected word line in the selected sub-block while programming the first group of memory cells, wherein the second group are connected to the selected word line, the second group of the memory cells reside on a second group of the NAND strings in the selected sub-block; and applying erase conditions to the second group of the memory cells in the selected sub-block while inhibiting erase of all other memory cells in the selected block after programming the first group to lower threshold voltages of respective memory cells in the second group, including applying a second erase voltage pulse to selected bit lines associated with the second group of the NAND strings while applying a GIDL voltage to the drain side select line in the selected sub-block to create GIDL currents in the second group of the NAND strings and while applying the non-negative erase enable voltage to the selected word line, wherein inhibiting erase of all other memory cells in the selected block includes applying a voltage that is less than a magnitude of the second erase voltage pulse to unselected bit lines associated with the first group of NAND strings while applying a voltage greater than the GIDL voltage to unselected drain side select lines of unselected sub-blocks in the selected block, wherein a first plurality of the NAND strings in the unselected sub-blocks are associated with the selected bit lines and a second plurality of the NAND strings in the unselected sub-blocks are associated with the unselected bit lines.

11. A non-volatile storage system, the system comprising:
a three-dimensional memory structure comprising blocks, each block having a stack of alternating dielectric layers and conductive layers and NAND strings extending through the alternating dielectric layers and conductive layers, each NAND string having memory cells and a drain side select transistor, the conductive layers including word lines with each word line connecting to one memory cell on each NAND string in the block, each block divided into sub-blocks with each sub-block having a group of the NAND strings, each sub-block having a drain side select line in a drain side select layer of the conductive layers, the drain side select line of the sub-block connecting to the drain side select transistor on each NAND string in the sub-block, the three-dimensional memory structure having bit lines associated with the NAND strings in the blocks;

first erase means for erasing memory cells in a selected block to an erase state, the erase state associated with an erase threshold voltage, the first erase means further for applying a first erase voltage pulse to the bit lines associated with the NAND strings of the selected block while applying a voltage to the drain side select lines of the selected block to create gate-induced drain leakage (GIDL) currents in the NAND strings of the selected block and while applying a non-negative erase enable voltage to the word lines of the selected block;

program means for programming a first group of the memory cells connected to a selected word line in a selected sub-block in the selected block from the erase state to target data states while inhibiting a second group of the memory cells connected to the selected word line in the selected sub-block from programming from the erase state and inhibiting a third group of memory cells on the selected word line in unselected sub-blocks in the selected block from programming, each target data state associated with a threshold voltage that is greater than the erase threshold voltage, the first group of the memory cells on a first group of the NAND strings in the selected sub-block, the second group of memory cells on a second group of the NAND strings in the selected sub-block, the third group of memory cells residing on a third group of NAND strings in the unselected sub-blocks; and post-program erase means for applying erase conditions to the second group of the memory cells to lower the threshold voltage of respective memory cells in the second group while inhibiting erase of all other memory cells in the selected block after the first group of the memory cells are programmed to the target data states, wherein prior to applying the erase conditions the second group contains memory cells having a threshold voltage above an erase threshold voltage and memory cells having a threshold voltage below the erase threshold voltage, the post-program erase means for further for applying a second erase voltage pulse to selected bit lines associated with the second group of the NAND strings while applying a GIDL voltage to the drain side select line of the selected sub-block to create GIDL currents in the second group of the NAND strings and while applying the non-negative erase enable voltage to the selected word line, wherein inhibiting erase of all other memory cells in the selected block includes applying a voltage that is less than a magnitude of the second erase voltage pulse to unselected bit lines associated with the first group of NAND strings while applying a voltage greater than the GIDL voltage to unselected drain side select lines of the unselected sub-blocks, wherein a first plurality of the NAND strings in the unselected sub-blocks are associated with the selected bit lines and a second plurality of the NAND strings in the unselected sub-blocks are associated with the unselected bit lines.

12. The non-volatile storage system of claim 11, wherein the post-program erase means is further for:
applying the second erase voltage pulse to the selected bit lines associated with the second group of the NAND strings a single time without an erase verify.

13. The non-volatile storage system of claim 11, wherein the post-program erase means is further for:

floating a source line in the selected block while gener-
ating the GIDL currents in the second group of the
NAND strings.

14. The non-volatile storage system of claim 11, wherein
the voltage applied to the unselected drain side select lines
of the unselected sub-blocks has a magnitude of approxi-
mately the second erase voltage.

* * * * *